US009245781B2

(12) United States Patent
Takahara et al.

(10) Patent No.: US 9,245,781 B2
(45) Date of Patent: Jan. 26, 2016

(54) ARTICLE STORAGE FACILITY AND ARTICLE STORAGE METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 484 days.

(21) Appl. No.: 13/731,381

(22) Filed: Dec. 31, 2012

(65) Prior Publication Data
US 2014/0017040 A1 Jan. 16, 2014

(30) Foreign Application Priority Data
Jan. 4, 2012 (JP) .................................. 2012-000204

(51) Int. Cl.
*H01L 21/673* (2006.01)
*H01L 21/67* (2006.01)
*H01L 21/677* (2006.01)

(52) U.S. Cl.
CPC .... *H01L 21/67393* (2013.01); *H01L 21/67011* (2013.01); *H01L 21/67769* (2013.01)

(58) Field of Classification Search
CPC ................... H01L 21/67393; H01L 21/67769; H01L 21/673; H01L 21/67276; H01L 21/67389
USPC ........... 141/63, 65, 66; 414/222.01, 935, 940; 206/710–712
See application file for complete search history.

(56) References Cited

U.S. PATENT DOCUMENTS

| 5,700,127 | A | * | 12/1997 | Harada et al. | 414/416.08 |
|---|---|---|---|---|---|
| 5,879,458 | A | * | 3/1999 | Roberson et al. | 118/715 |
| 5,988,233 | A | * | 11/1999 | Fosnight et al. | 141/63 |
| 6,054,181 | A | * | 4/2000 | Nanbu et al. | 427/240 |
| 6,123,120 | A | * | 9/2000 | Yotsumoto et al. | 141/65 |
| 7,360,346 | B2 | * | 4/2008 | Miyajima et al. | 53/432 |
| 8,302,637 | B2 | * | 11/2012 | Okabe et al. | 141/98 |
| 8,418,733 | B2 | * | 4/2013 | Shikata et al. | 141/98 |
| 2005/0011851 | A1 | * | 1/2005 | Ikeya | 212/331 |
| 2005/0069420 | A1 | * | 3/2005 | Miyajima et al. | 417/53 |
| 2006/0288664 | A1 | * | 12/2006 | Okabe et al. | 53/510 |
| 2008/0069669 | A1 | * | 3/2008 | Kondoh et al. | 414/217.1 |
| 2010/0000625 | A1 | * | 1/2010 | Goto et al. | 141/4 |

FOREIGN PATENT DOCUMENTS

JP 201016199 A 1/2010
JP 2010182747 A 8/2010

* cited by examiner

*Primary Examiner* — Kevin P Shaver
*Assistant Examiner* — Andrew Stclair
(74) *Attorney, Agent, or Firm* — The Webb Law Firm

(57) ABSTRACT

An article storage facility includes a transport device for transporting containers to a plurality of storage sections, an inactive gas feed section which supplies inactive gas to the interior of the container stored in the storage section, and a controller for controlling operation of the device and operation of the flow rate adjusting device of the inactive gas feed section. The controller is configured to cause a state of the inactive gas feed section associated with the storage section to be both a storage feed state and an unfeeding state depending on if the carrier is stored or not stored be. The controller is also configured to store the transporting container in the storage section after changing the state of the inactive gas feed section associated with the storage section in which the container is to be stored to a pre-storage feed state from the unfeeding state.

10 Claims, 11 Drawing Sheets

ARTICLE STORAGE FACILITY AND ARTICLE STORAGE METHOD

FIELD OF THE INVENTION

The present invention relates to an article storage facility including a plurality of storage sections for storing transporting containers for housing substrates, a transport device for transporting the transporting containers to the plurality of storage sections, an inactive gas feed section configured to supply inactive gas to inside the transporting container that is stored in associated one of the plurality of storage sections, and a controller for controlling operations of the transport device and the flow rate adjusting device, as well as to an article storage method that uses such article storage facility.

BACKGROUND

Article storage facilities such as one described above have a purging function whereby inactive gas is supplied to transporting containers stored in storage sections to prevent degradation of substrates in the transporting containers. As a specific example, a storage shelf, including a plurality of storage sections for storing transporting containers such as FOUPs for housing semiconductor wafers, is configured as an article storage shelf with a purge function. This article storage shelf includes, for each of the storage sections, a supply nozzle as an inactive gas feed section which supplies inactive gas, such as nitrogen gas and gaseous argon, to the interior of respective transporting container.

An example of such an article storage facility is disclosed in JP Publication Of Application No. 2010-16199 (Patent Document 1), which describes the following technology for reducing the amount of inactive gas consumption as much as possible to reduce the running cost of the facility. The technology involves a capability to change the flow rate of the inactive gas injected from the supply nozzle depending on whether the transporting container is stored in the storage section, such that the flow rate of inactive gas for when the transporting container is not stored in the storage section is less than the flow rate for when the transporting container is stored in the storage section.

More specifically, in the facility of Patent Document 1, the flow rate of inactive gas for when the transporting container is stored in the storage section is set to be a flow rate necessary to supply sufficient amount of inactive gas to the transporting container (referred to as the "first flow rate"). On the other hand, the discharge flow rate for when the transporting container is not stored in the storage section is designed to prevent impurities (i.e. contaminants), such as particles and vapor, from accumulating in the inactive gas feed section and is set to a flow rate (referred to as the "second flow rate") which is less than the first flow rate. This helps prevent the impurities that causes degradation of the substrates from accumulating in the inactive gas feed section while the transporting container is not stored in the storage section. Thus, efforts are made to reduce running cost of the facility while retaining the facility's ability to supply inactive gas that is as pure as possible, to the transporting container after the transporting container is stored in the storage section.

However, in the facility of Patent Document 1, the inactive gas is normally emitted to the open space from the supply nozzle at the second flow rate when the transporting container is not stored in the storage section. Thus, there is a problem that a large amount of inactive gas is wasted since the inactive gas which should have been supplied to a transporting container is released to open space without being supplied to the transporting container.

SUMMARY OF THE INVENTION

In light of the background described above, there is a desire for an article storage facility in which degradation of substrates in transporting containers can be prevented while the amount of the inactive gas used is reduced.

The article storage facility in accordance with the present invention comprises:

a plurality of storage sections for storing transporting containers for housing substrates;

a transport device for transporting the transporting containers to the plurality of storage sections;

an inactive gas feed section provided to each of the plurality of the storage sections wherein the inactive gas feed section includes a discharge opening for discharging inactive gas and a flow rate adjusting device which can adjust a flow rate of the inactive gas discharged from the discharge opening wherein the inactive gas feed section is configured to supply the inactive gas to inside the transporting container that is stored in associated one of the plurality of storage sections;

a controller for controlling operations of the transport device and the flow rate adjusting device;

wherein the controller is configured to keep track of whether the transporting container is stored for each of the plurality of storage sections and to control operation of the flow rate adjusting device of each of a plurality of the inactive gas feed sections in order to cause a state of the inactive gas feed section associated with the storage section in which the transporting container is stored to be a storage feed state in which the inactive gas is discharged from the discharge opening and to cause a state of the inactive gas feed section associated with the storage section in which none of the transporting containers is stored to be an unfeeding state in which the inactive gas is not discharged from the discharge opening; and wherein when storing the transporting container in the storage section with the said transport device, the controller is further configured to control operation of the transport device and operation of the flow rate adjusting device in order to store the transporting container in the storage section after changing the state of the inactive gas feed section associated with the storage section in which the transporting container is to be stored from the unfeeding state to a pre-storage feed state in which the inactive gas is discharged from the discharge opening.

With the above-described arrangement, since the state of the inactive gas feed section associated with the storage section in which the transporting container is stored is changed to the storage feed state, the inactive gas can be supplied from the inactive gas feed section to the transporting container stored in the storage section. In addition, since state of the inactive gas feed section associated with the storage section in which the transporting container is not stored is changed to the unfeeding state, the inactive gas is not supplied from the inactive gas feed section to the storage section in which no transporting container is stored, thereby reducing unnecessary use of inactive gas.

Moreover, when storing a transporting container in a storage section, the transporting container is stored in the storage section after discharging the inactive gas from the discharge opening by changing the state of the inactive gas feed section associated with the storage section in which the transporting container is to be stored to the pre-storage feed state from the unfeeding state. Thus, even if impurities accumulate in the inactive gas feed section while the inactive gas feed section is in the unfeeding state, the inactive gas feed section can be cleaned by the inactive gas supplied in the pre-storage feed state before the transporting container is stored in the storage section. Thus, the impurities can be prevented from entering the transporting container from the inactive gas feed section. Thus, even if the inactive gas is not constantly discharged into the storage section in which no transporting container is stored, degradation of substrates in the transporting container can be prevented by preventing the impurities from entering the transporting container.

Thus, with the above-described arrangement, degradation of substrates in transporting containers can be prevented while the amount of the inactive gas used is reduced.

The technical features of the article storage facility in accordance with the present invention can be applied also to an article storage method; therefore, such a method is understood to be within the scope of the present invention. The functions and effects of the article storage facility described above can also be achieved by the article storage method.

Specifically, an article storage method in accordance with the present invention that uses an article storage facility including a plurality of storage sections for storing transporting containers for housing substrates;

a transport device for transporting the transporting containers to the plurality of storage sections;

an inactive gas feed section provided to each of the plurality of the storage sections wherein the inactive gas feed section includes a discharge opening for discharging inactive gas and a flow rate adjusting device which can adjust a flow rate of the inactive gas discharged from the discharge opening wherein the inactive gas feed section is configured to supply the inactive gas to inside the transporting container that is stored in associated one of the plurality of storage sections; and a controller for controlling operations of the transport device and the flow rate adjusting device, the article storage method includes the following steps that are performed by the controller:

a first control step of keeping track of whether the transporting container is stored for each of the plurality of storage sections and controlling operation of the flow rate adjusting device of each of a plurality of the inactive gas feed sections in order to cause a state of the inactive gas feed section associated with the storage section in which the transporting container is stored to be a storage feed state in which the inactive gas is discharged from the discharge opening and to cause a state of the inactive gas feed section associated with the storage section in which none of the transporting containers is stored to be an unfeeding state in which the inactive gas is not discharged from the discharge opening; and a second control step of controlling operation of the transport device and operation of the flow rate adjusting device in order to store the transporting container in the storage section after changing the state of the inactive gas feed section associated with the storage section in which the transporting container is to be stored from the unfeeding state to a pre-storage feed state in which the inactive gas is discharged from the discharge opening, when storing the transporting container in the storage section with the said transport device.

Examples of preferred embodiments of the present invention are described next.

In an embodiment of the article storage facility in accordance with the present invention, an operational state of the transport device that occurs at a certain point in time before the transporting container is transported to and reaches the storage section is preferably defined in advance to be an inactive gas feed start state, and wherein the controller is preferably configured to control operation of the flow rate adjusting device in order to change the state of the inactive gas feed section associated with the storage section in which the transporting container is to be stored from the unfeeding state to the pre-storage feed state if the operational state of the transport device becomes the inactive gas feed start state and thereafter to maintain the pre-storage feed state until a set period elapses.

With the above-described arrangement, when the operational state of the transport device becomes the inactive gas feed start state, the state of the inactive gas feed section associated with the storage section in which the transporting container is to be stored is changed from the unfeeding state to the pre-storage feed state. And thereafter, the inactive gas is discharged from the discharge opening in the pre-storage feed state until the set period elapses. Thus, since the inactive gas is discharged from the discharge opening for the set period at a suitable point in time during the storing process of the transporting container to the storage section with the transport device, the inactive gas feed section that was in the unfeeding state can be cleaned properly in time for storing the transporting container.

In addition, the inactive gas feed start state may be defined to be the operational state of the transport device when it is operating to receive the transporting container to be transported, or may be defined to be the operational state when the transport device has just received the transporting container or when the transport device is actually transporting the transporting container after receiving the transporting container. In addition, the inactive gas feed start state may be defined such that it has a certain range in time and/or space.

In an embodiment of the article storage facility in accordance with the present invention, if the transporting container has not reached the storage section when the set period has elapsed after changing the state of the inactive gas feed section associated with the storage section in which the transporting container is to be stored from the unfeeding state to the pre-storage feed state, the controller is preferably configured to control operation of the flow rate adjusting device in order to change the state of the inactive gas feed section to the unfeeding state from the pre-storage feed state and thereafter to change the state of the inactive gas feed section from the unfeeding state to the storage feed state if the transporting container reaches the storage section.

With the above-described arrangement, it is understood that the inactive gas feed section associated with the storage section is sufficiently cleaned by discharging the inactive gas in the pre-storage feed state for the set period of time provided that the set period has elapsed since the supply of the inactive gas in the pre-storage feed state was started before the transporting container is stored in the storage section in which it is to be stored. And by not supplying the inactive gas until the transporting container is stored in the storage section after the set-period has elapsed, the amount of the inactive gas used can be reduced as much as possible.

And even if the time, required to transport the transporting container to the storage section in which the container is to be stored after the operational state of the transport device becomes the inactive gas feed start state, is different for each storage section, the feed period of the inactive gas in the pre-storage feed state is kept constant among all of the plurality of storage sections to prevent variation in the degree of cleaning among the inactive gas feed sections.

In an embodiment of the article storage facility in accordance with the present invention, the controller is preferably configured to perform a transport restraint control in which transporting of the transporting container to the storage section by the transport device is not allowed to complete until the set period has elapsed after changing the state of the inactive gas feed section associated with the storage section in which the transporting container is to be stored from the unfeeding state to the pre-storage feed state.

With the above-described arrangement, when the controller performs the transport restraint control, the transporting container is not stored in the storage section in which the transporting container is to be stored until the set period has elapsed after the state of the inactive gas feed section is changed from the unfeeding state to the pre-storage feed state. Thus, cleaning of the inactive gas feed section can be properly performed for the set period because the inactive gas can be discharged in the pre-storage feed state for the set period while the container is not stored in the storage section.

In an embodiment of the article storage facility in accordance with the present invention, a feed state determination position is preferably set to be closer to a position of the storage section in which the container is to be stored, in the transporting path for the transport device, than to a position of the transporting container when the operational state of the transport device becomes the inactive gas feed start state wherein the controller is preferably configured to control operations of the flow rate adjusting device and the transport device in order to stop transport operation of the transport device if the state of the inactive gas feed section associated with the storage section in which the container is to be stored is the pre-storage feed state when the transporting container is transported by the transport device to and reaches the feed state determination position, and in order to resume the transport operation of the transport device after supplying of the inactive gas by the inactive gas feed section in the pre-storage feed state is completed.

With the above-described arrangement, a simple control of stopping the operation of the transport device can be used to ensure that the transporting container is not stored in the storage section in which the transporting container is to be stored until the set period has elapsed after the state of the inactive gas feed section was changed from the unfeeding state to the pre-storage feed state.

And the feed state determination position is close to the storage section in which the transporting container is to be stored along the transporting path of the transport device. Thus, the transporting container to be transported can be stored in the storage section in which the transporting container is to be stored, immediately after the supply of the inactive gas in the pre-storage feed state by the inactive gas feed section associated with the storage section in which the transporting container is to be stored is completed. As a result, the transporting container can be stored as quickly as possible in the storage section in which the transporting container is to be stored.

In an embodiment of the article storage facility in accordance with the present invention, the controller is preferably configured to control operations of the flow rate adjusting device and the transport device in order to maintain the supplying of the inactive gas by the inactive gas feed section in the pre-storage feed state until the transporting container reaches the storage section if the transporting container has not reached the storage section when the set period has elapsed after changing the state of the inactive gas feed section associated with the storage section in which the transporting container is to be stored from the unfeeding state to the pre-storage feed state.

With the above-described arrangement, dust, ambient vapor, and oxygen can be prevented from entering the inactive gas feed section after the set period has elapsed since the state of the inactive gas feed section was changed to the pre-storage feed state and until the transporting container is transported to the storage section. Thus, dust, ambient vapor, and oxygen can be prevented from entering the transporting container when supply of the inactive gas in the storage feed state is started after the transporting container is stored in place.

In an embodiment of the article storage method in accordance with the present invention, an operational state of the transport device that occurs at a certain point in time before the transporting container is transported to and reaches the storage section is preferably defined in advance to be an inactive gas feed start state wherein, in the second control step, operation of the flow rate adjusting device is preferably controlled in order to change the state of the inactive gas feed section associated with the storage section in which the transporting container is to be stored from the unfeeding state to the pre-storage feed state if the operational state of the transport device becomes the inactive gas feed start state and thereafter to maintain the pre-storage feed state until a set period elapses.

In an embodiment of the article storage method in accordance with the present invention, in the second control step, if the transporting container has not reached the storage section when the set period has elapsed after changing the state of the inactive gas feed section associated with the storage section in which the transporting container is to be stored from the unfeeding state to the pre-storage feed state, operation of the flow rate adjusting device is preferably controlled in order to change the state of the inactive gas feed section to the unfeeding state from the pre-storage feed state and thereafter to change the state of the inactive gas feed section from the unfeeding state to the storage feed state if the transporting container reaches the storage section.

In an embodiment of the article storage method in accordance with the present invention, in the second control step, a transport restraint control is preferably performed in which transporting of the transporting container to the storage section by the transport device is not allowed to complete until the set period has elapsed after changing the state of the inactive gas feed section associated with the storage section in which the transporting container is to be stored from the unfeeding state to the pre-storage feed state.

In an embodiment of the article storage method in accordance with the present invention, a feed state determination position preferably is set to be closer to a position of the storage section in which the container is to be stored, in the transporting path for the transport device, than to a position of the transporting container when the operational state of the transport device becomes the inactive gas feed start state wherein, in the second control step, operations of the flow rate adjusting device and the transport device are preferably controlled in order to stop transport operation of the transport device if the state of the inactive gas feed section associated with the storage section in which the transporting container is to be stored is the pre-storage feed state when the transporting container is transported by the transport device to and reaches the feed state determination position, and in order to resume the transport operation of the transport device after supplying of the inactive gas by the inactive gas feed section in the pre-storage feed state is completed.

In an embodiment of the article storage method in accordance with the present invention, in the second control step, operations of the flow rate adjusting device and the transport device are preferably controlled in order to maintain the supplying of the inactive gas by the inactive gas feed section in the pre-storage feed state until the transporting container reaches the storage section if the transporting container has not reached the storage section when the set period has elapsed after changing the state of the inactive gas feed section associated with the storage section in which the transporting container is to be stored from the unfeeding state to the pre-storage feed state.

DETAILED DESCRIPTION

Embodiments of the present invention as applied to an article storage facility with a purging function are described next with reference to the accompanying drawings.
(Overall Construction)

Figure 1:
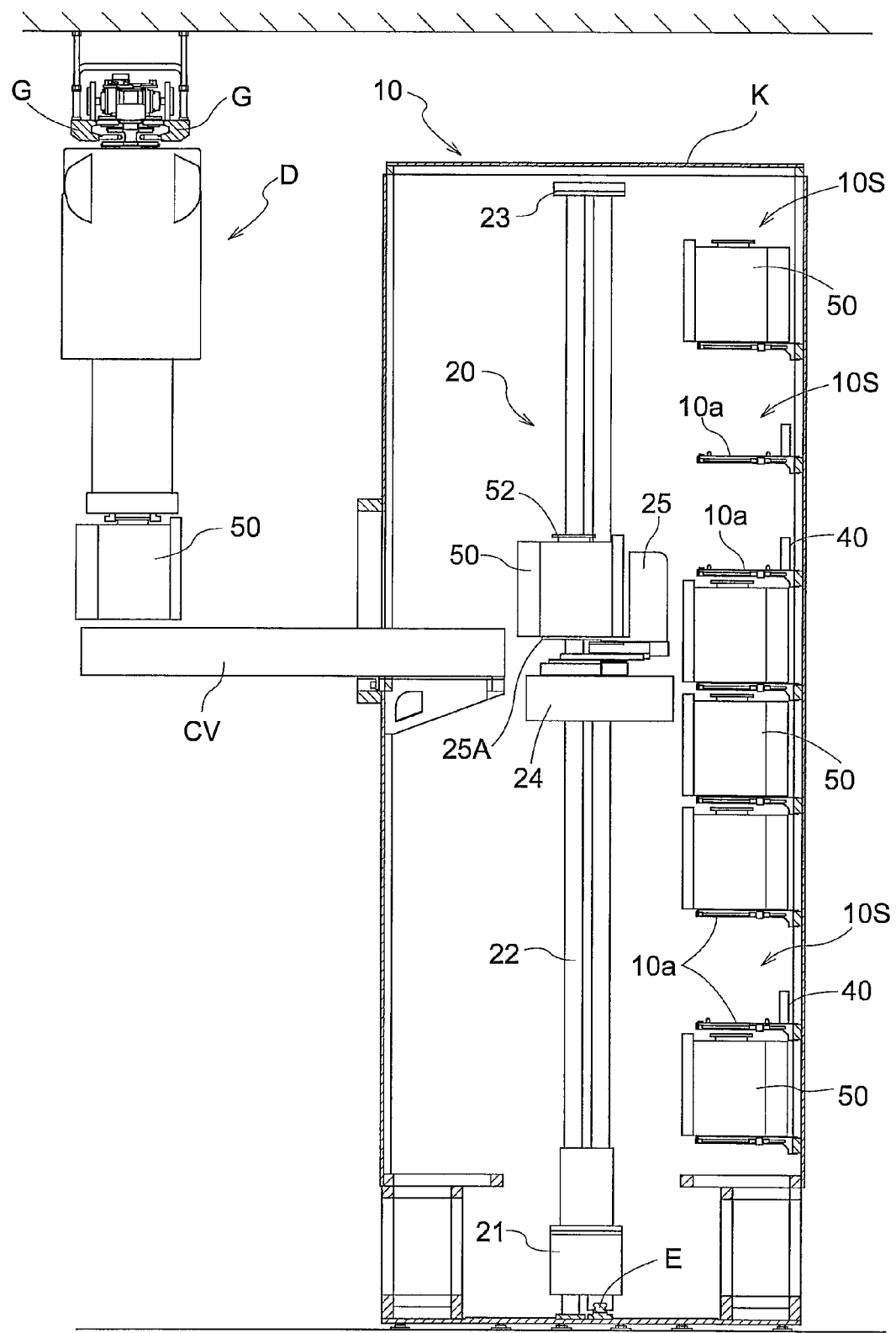
FIG. 1 is a vertical sectional side view of an article storage facility.
Figure 2:
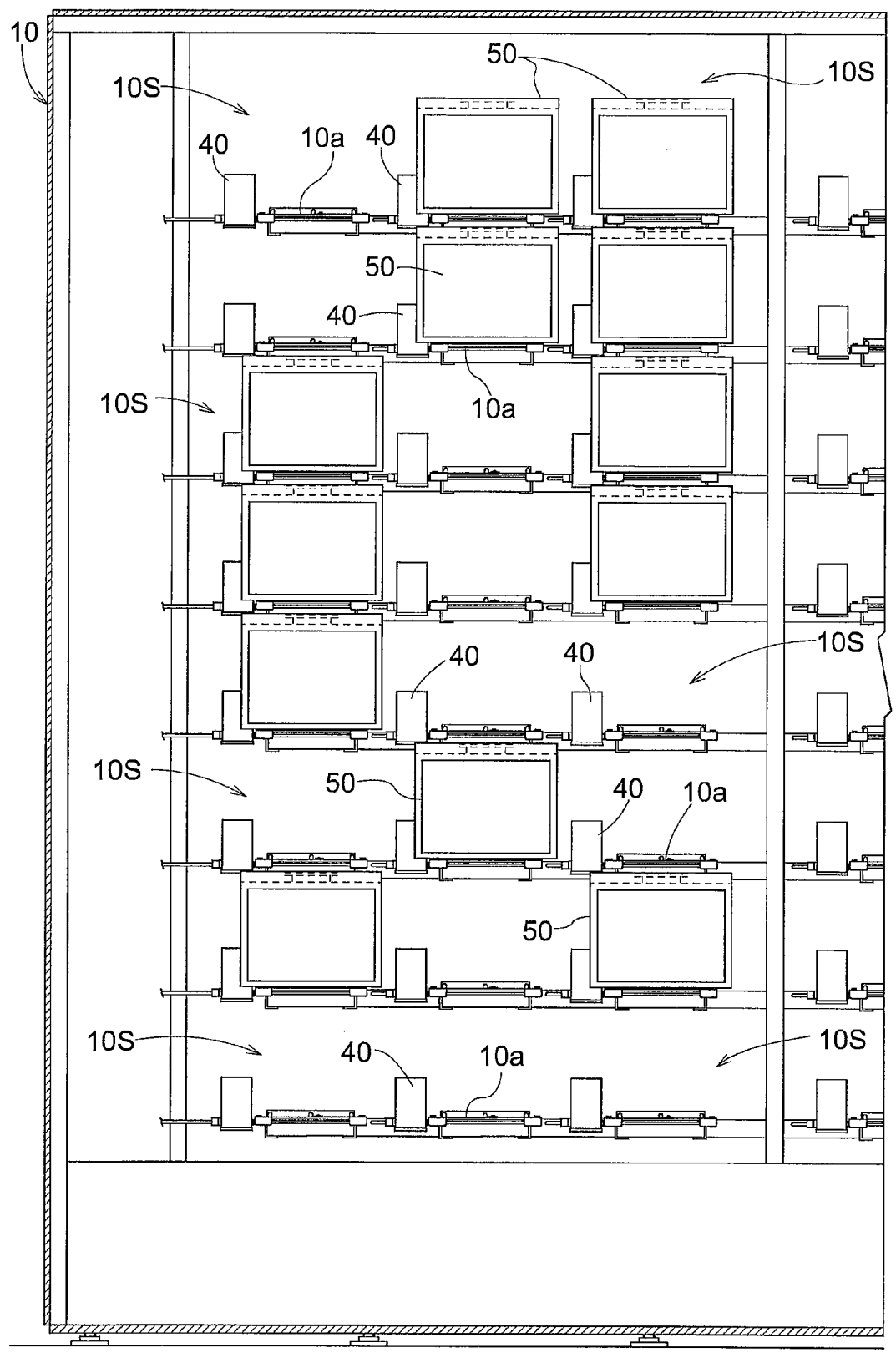
FIG. 2 is a vertical sectional front view showing a part of the facility in FIG. 1.

As shown in FIGS. 1 and 2, an article storage facility includes a storage shelf 10 for storing transporting containers 50 (referred to, hereinafter, as "containers 50" for short) each for housing substrates therein in a sealed state, a stacker crane 20 which functions as a transport device, and a carry in and out conveyor CV which functions as a carry in and out section for the containers 50.

The storage shelf 10 and the stacker crane 20 are disposed in an installation space whose outer periphery is covered with and defined by walls K. And the carry in and out conveyor CV is disposed such that it extends through a wall K.

The storage shelf 10 includes a plurality of storage sections 10S, which function as support portions for supporting the containers 50 and which are juxtaposed along the vertical direction and the right and left direction (i.e. lateral direction) with each of the plurality of storage sections 10S configured to store a container 50, details of which are described below.

And, in the present embodiment, as shown in FIG. 1, a hoist-type transport vehicle D is provided which travels along a guide rail G attached to the ceiling portion of a cleanroom in which the article storage facility is installed. The hoist-type transport vehicle D carries the containers 50 to and from the carry in and out conveyor CV one container 50 at a time.

One of the ends of the carry in and out conveyor CV that is located outside the installation space is defined as a delivering and receiving location whereas the other end within the installation space is defined as a carry in and out location. Delivering and receiving (i.e., transfer) of the containers 50 between the carry in and out conveyor CV and the hoist-type transport vehicle D is performed in the delivering and receiving location whereas delivering and receiving (i.e., transfer) of the containers 50 between the carry in and out conveyor CV and the stacker crane 20 is performed in a carry in and out location.
(Construction of Container 50)

Each container 50 is a sealed container made of synthetic resin in compliance with the SEMI (Semiconductor Equipment and Material Institute) standards and is used for housing semiconductor wafers W (see FIG. 4) which are an example of substrates. This container 50 is referred to as a FOUP (Front Opening Unified Pod). And, though not detailed herein, formed in the front face of each container 50 is an opening which is for taking the substrates in and out and which can be opened and closed with a detachable lid. And a top flange 52 which can be gripped by the hoist-type transport vehicle D is formed in the upper face of the container 50. Three engagement grooves (not shown) that can be engaged by positioning pins 10b (see FIG. 3) are formed in the bottom face of the container 50.

Figure 4:
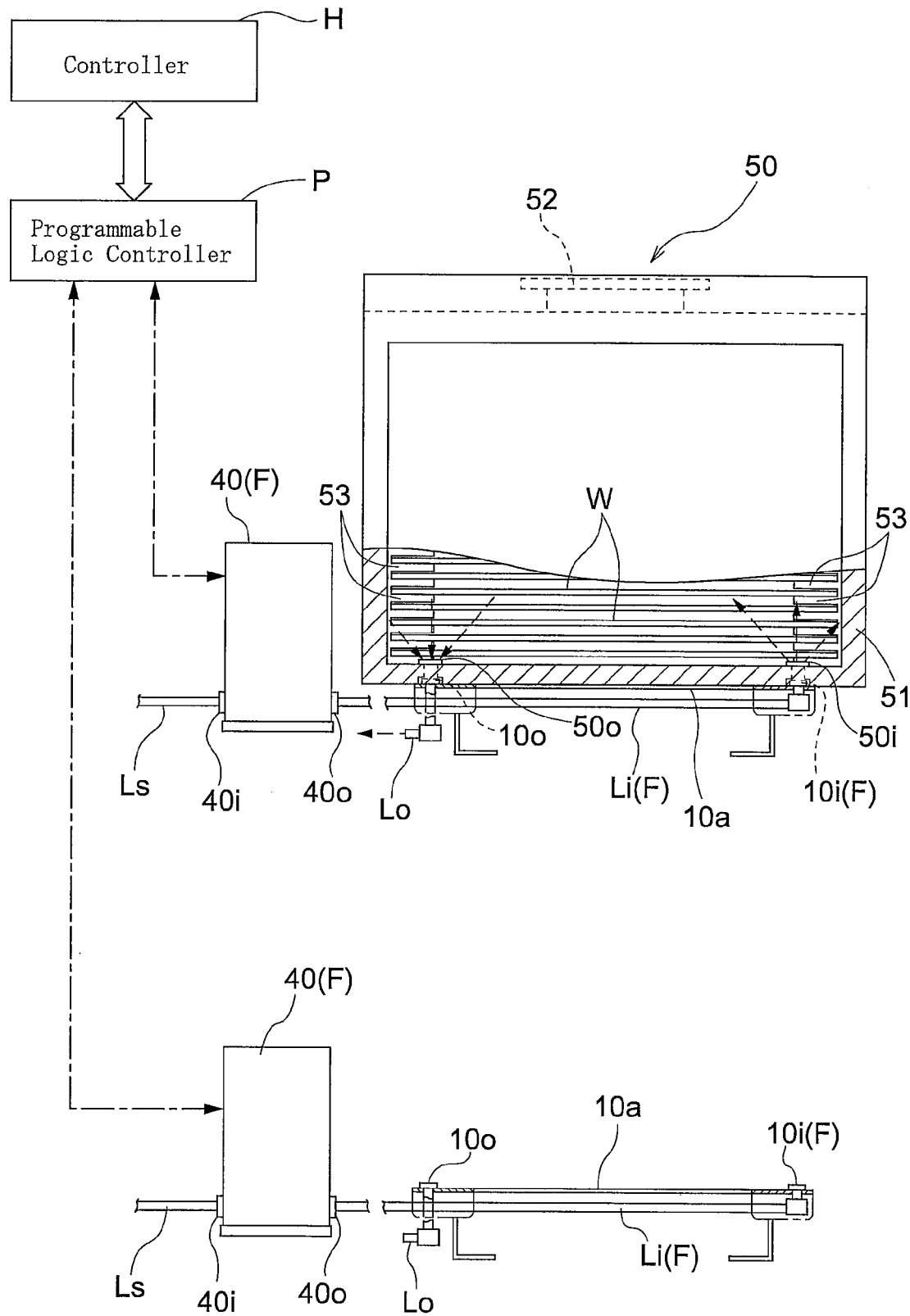
FIG. 4 is a schematic structural drawing showing the relationship between a storage section and a transporting container.

More particularly, as shown in FIG. 4, the container 50 includes a casing 51 having substrate supports 53 capable of receiving and supporting a plurality of semiconductor wafers W at different vertical positions therein, and a lid (not shown). The container 50 is configured such that the inner space thereof is sealed against leakage when the lid is attached to the casing 51 and such that the container 50 is fixed in position by the positioning pins 10b when the container 50 is stored in the storage section 10S.

Further, as shown in FIG. 4, provided in the bottom of the container 50 are a gas feed opening 50i for introducing nitrogen gas which is an example of inactive gas, and a gas discharge opening 50o. Though not shown, the gas feed opening 50i is provided with an introducing side opening and closing valve: and the gas discharge opening 50o is provided with a discharging side opening and closing valve.

The introducing side opening and closing valve is urged in its closing direction or toward its closed position by means of an urging member such as a spring. When the discharge pressure of nitrogen gas fed to the gas feed opening 50i becomes equal to or higher than a set valve opening pressure which is higher than the atmospheric pressure by a set value, the introducing side opening and closing valve is opened by this pressure.

Further, the discharging side opening and closing valve is urged in the closing direction or toward its closed position by an urging member such as a spring, so that when the pressure inside the container 50 becomes equal to or higher than a set valve opening pressure which is higher than the atmospheric pressure by a set value, the valve is opened by this pressure.
(Construction of Stacker Crane 20)

The stacker crane 20 includes a traveling carriage 21 which can travel along a travel rail E installed on the floor on the side of the front face of the storage shelf 10, a mast 22 mounted erect on the traveling carriage 21, and a lift deck 24 which can be moved up and down, or vertically, while being guided by the mast 22.

Incidentally, though not shown, an upper frame 23 provided at the upper end of the mast 22 is configured to be moved while engaged with an upper guide rail attached to the ceiling of the installation space whose outer periphery is covered by the walls K.

A transfer device 25 for transferring the container 50 to and from the storage section 10S is mounted on the lift deck 24.

The transfer device 25 includes a plate-like support body 25A which receives and supports the container 50 thereon such that the support body 25A can be projected and retracted between a projected position in which the support body 25A is projected into the storage section 10S and a retracted position in which the support body 25A is retracted toward the lift deck 24 side. The stacker crane 20 including the transfer device 25 is configured to perform an unloading operation for unloading the container 50 placed on the support body 25A onto the storage section 10S, and a retrieval operation for retrieving the container 50 stored in the storage section 10S, by projecting and retracting the support body 25A and by vertically moving the lift deck 24.

In other words, the container 50 is placed in the delivering and receiving location of the carry in and out conveyor CV by the transport vehicle D and is then transported by the carry in and out conveyor CV from the delivering and receiving location which is outside the wall K to the carry in and out location which is inside the wall K. Subsequently, the container 50 is transported by the stacker crane 20 to an empty storage section 10S among the plurality of storage sections 10S.

Thus, in the present embodiment, the stacker crane 20 is provided as a transport device for transporting containers 50 to the plurality of storage sections 10S. The stacker crane 20 includes a transfer device 25 for transferring a container 50 to a storage section 10S, a traveling carriage 21 and a lift deck 24 which function as moving devices for moving the transfer device 25 to transfer positions which are associated with respective storage sections 10S. And when transporting a container 50 to a storage section 10S, a crane controller H3 is configured to control operation of the stacker crane 20 to transfer the container 50 with the transfer device 25 after moving the transfer device 25 with the traveling carriage 21 and the lift deck 24 to the transfer position associated with the target storage section 10S.

While not shown, the stacker crane 20 has a traveling position detector for detecting the traveling position along the travel path and a vertical position detector for detecting the vertical position of the lift deck 24. The crane controller H3 which controls the operation of the stacker crane 20 is configured to control the operation of the stacker crane 20 based on the detected information from the travel position detector and the vertical position detector. In addition, the transfer device 25 has a rotary encoder which functions as a projected and retracted position detector for detecting the projected and retracted position of the support body 25A, and a container detection sensor for detecting whether a container 50 is received and supported on the support body 25A. And the crane controller H3 is configured to control the operation of the transfer device 25 based on the detected information from these sensors. Thus, the crane controller H3 is configured to control the operational state of the traveling carriage 21, the lift deck 24, and the transfer device 25.

And the crane controller H3 is configured to transport a container 50 by controlling the traveling operation of the traveling carriage 21 and the vertical movement operation of the lift deck 24 as well as the projecting and retracting operation of the support body 25A of the transfer device 25 in order to perform a carry-in operation in which the container 50 that has been moved to the carry in and out location of the carry in and out conveyor CV is received and stored in a storage section 10S, and a carry-out operation in which the container 50 stored in the storage section 10S is taken out from the storage section 10S and is delivered to the carry in and out location of the carry in and out conveyor CV.

A command to perform the carry-in operation and the carry-out operation is issued by a stocker controller H2 to the crane controller H3. In addition, the crane controller H3 is configured to transmit to the stocker controller H2 information indicating the completion of the traveling operation of the traveling carriage 21, information indicating the completion of a vertical movement of the lift deck 24, and information indicating the completion of a receiving or retrieving operation or the completion of a delivery or unloading operation by the transfer device 25 of the container 50.

(Construction of Storage Unit 10S)

Figure 3:
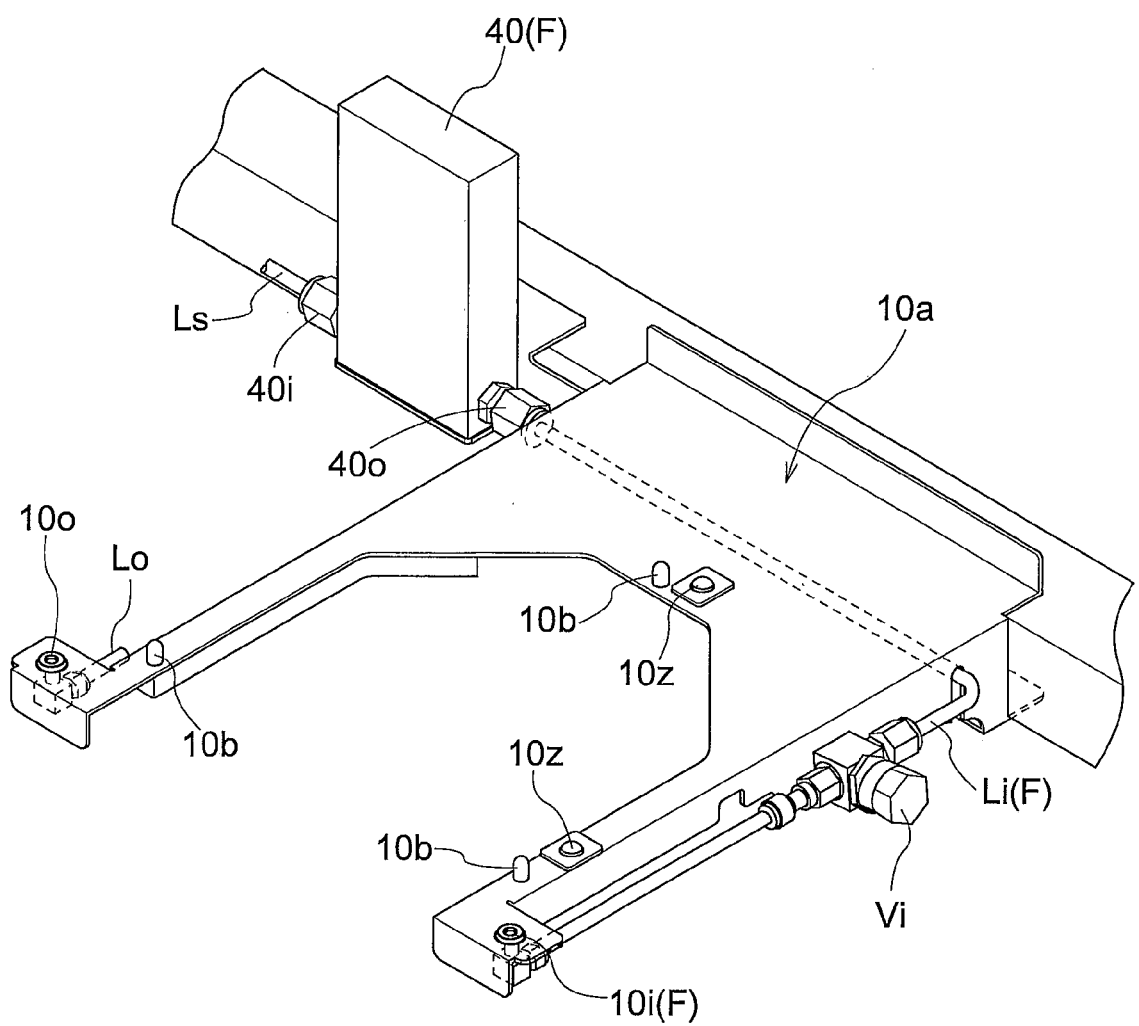
FIG. 3 is a perspective view of a storage section.

As shown in FIGS. 3 and 4, each of the plurality of storage sections 10S includes a plate-shaped receiving support portion 10a for receiving and supporting a container 50.

The receiving support portion 10a is formed to have a U-shape in plan view to define a space through which the support body 25A of the transfer device 25 can pass in the vertical direction. The receiving support portion 10a has the upwardly projecting positioning pins 10b on its top surface as described above.

In addition, the receiving support portion 10a has two container sensors 10z for detecting whether the container 50 is placed properly. And the detected information from these sensors 10z are input into a purge controller H1 (see FIG. 5) which manages operation of a mass flow controller 40 which functions as a flow rate adjusting device described later.

The receiving support portion 10a includes a discharge nozzle 10i which functions as a discharge opening for feeding nitrogen gas, which is an example of inactive gas, to inside the container 50 and a discharging gas passage body 10o through which gas discharged from inside the container 50 passes. And a mass flow controller 40 (see FIGS. 1 through 3) for controlling the feeding of nitrogen gas is provided on a deep or far side of each storage section 10s and between two laterally adjacent storage sections 10s in plan view. The deep or far side of each storage section 10s in the plan view is the side of the end opposite to the opening or entrance for carrying in and out the container 50.

Each mass flow controller 40 is located where a storage section 10S of the storage shelf 10 and support columns therefor do not exist in plan view and where the container 50 does not exist or interfere even when the container 50 is stored in the storage section 10S. In other words, an uninterrupted space is formed in the vertical direction of the storage shelf 10 at each location where the mass flow controllers 40 is located. Therefore, the air current created by the heat generated by the mass flow controller 40 can flow from an lower end of the storage shelf 10 to its upper end without interruption by obstacles, thus, preventing the accumulation of the heat radiated from the mass flow controller 40. This helps prevent failures such as malfunctioning of the mass flow controller 40 caused by heat.

A feed pipe Li which allows the nitrogen gas from the mass flow controller 40 to flow is connected to the discharge nozzle 10i. And an exhaust pipe Lo with an open end is connected to the discharging gas passage body 10o.

When the container 50 is received and supported on and by the receiving support portion 10a, the discharge nozzle 10i is fit into and connected to the gas feed opening 50i of the container 50 and the discharging gas passage body 10o is fit into and connected to the gas discharge opening 50o of the container 50.

Then, with the container 50 received and supported on and by the receiving support portion 10a, nitrogen gas is discharged from the discharge nozzle 10i at a pressure higher than the atmospheric pressure by a set value, whereby the gas present inside the container 50 is discharged through the gas discharge opening 50o to the outside and the nitrogen gas can be introduced to inside the container 50 through the gas feed opening 50i of the container 50.

In the present embodiment, an inactive gas feeding section F consists mainly of the mass flow controller 40, the feed pipe Li, and the discharge nozzle 10i.

In other words, the inactive gas feeding section F includes the discharge nozzle 10i for discharging the inactive gas and the mass flow controller 40 capable of adjusting the flow rate of the inactive gas that is discharged from this discharge nozzle 10i, and is configured to feed the inactive gas to inside the container 50 stored in the storage section 10S. And, this inactive gas feeding section F is provided to each of the plurality of storage sections 10S.

Incidentally, as shown in FIG. 3, the feed pipe Li incorporates a manually operated opening and closing valve Vi so that the feeding of the nitrogen gas can be stopped at the time of e.g. an emergency due to malfunctioning of the mass flow controller 40.

(Construction of Mass Flow Controller 40)

As shown in FIG. 3 and FIG. 4, each mass flow controller 40 includes an introducing side port 40i and a discharging side port 40o. The feed pipe Li described above is connected to the discharging side port 40o whereas a feed pipe Ls which directs the nitrogen gas from a nitrogen gas supply source is connected to the introducing side port 40i.

The nitrogen gas supply source has, among other things, a governor which adjusts the supply pressure of nitrogen gas to a pressure greater than the atmospheric pressure by a value greater than or equal to a preset value, and a manually operated opening and closing valve which allows and cuts off supply of nitrogen gas.

The mass flow controller 40 includes a flow rate adjusting valve for variably adjusting the flow rate of the nitrogen gas that flows in the inner passage from the introducing side port 40i to the discharging side port 40o, a flow rate sensor for determining the flow rate of the nitrogen gas that flows in the inner passage, and an internal control unit for controlling the operations of the flow rate adjusting valve.

And, the internal control unit is configured to control the flow rate adjusting valve based on the detection information from the flow rate sensor so as to adjust the feed rate to the container 50 to a target flow rate commanded by the aforementioned purge controller H1. That is, the purge controller H1 is configured to control the operations of the mass flow controllers 40.

(Construction of Controller H)

Figure 5:
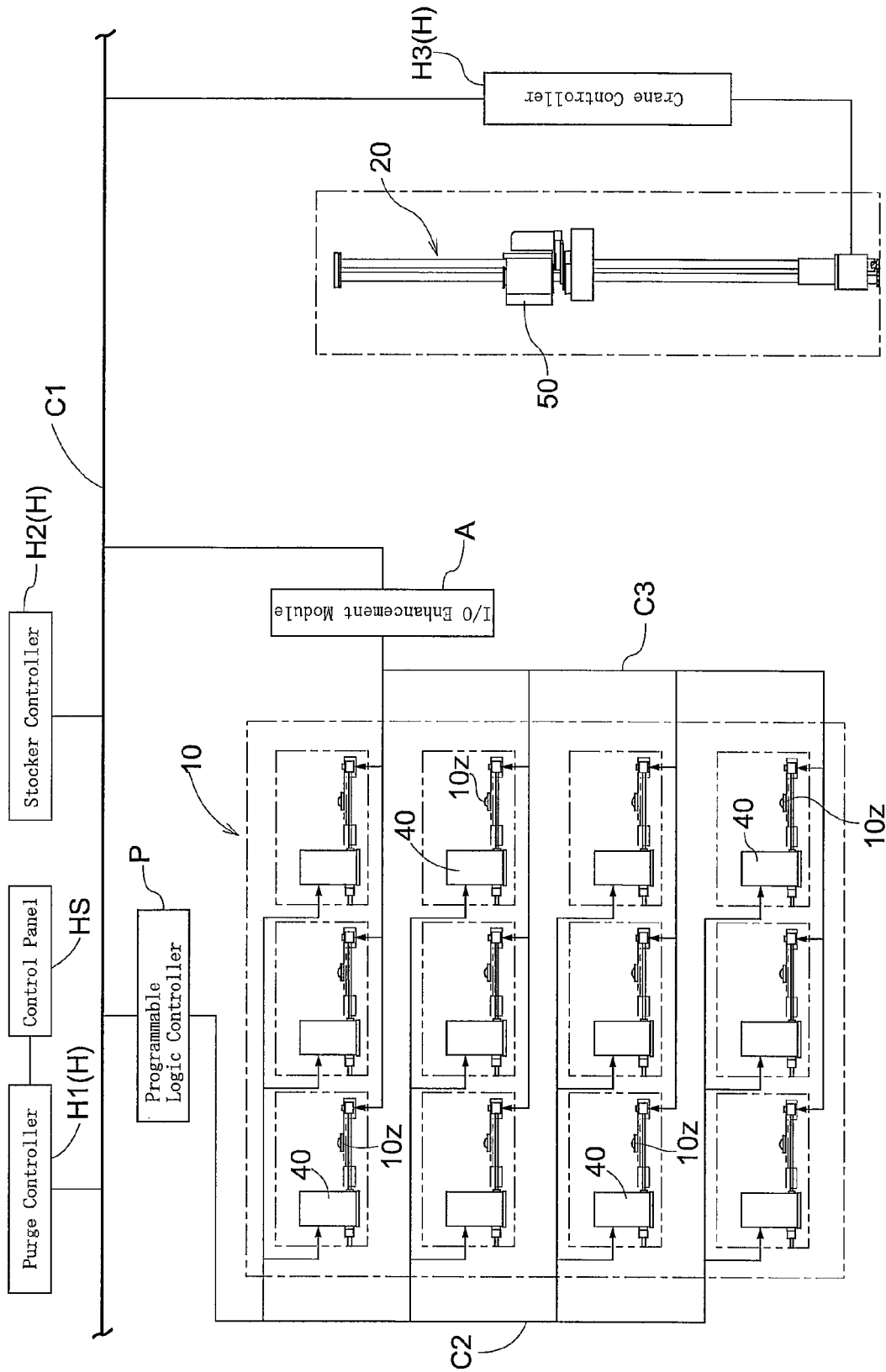
FIG. 5 shows how a controller is connected to various parts of the facility.

As shown in FIG. 5, the controller H includes, among other things, the purge controller H1 which controls the mass flow controllers 40, the stocker controller H2 which manages, among other things, the storage status of the containers 50 in the storage shelf 10, and the crane controller H3 which controls the operation of the stacker crane 20. The purge controller H1, the stocker controller H2, and the crane controller H3 are computers that process information using e.g. stored programs and are mutually connected by a network C1, such as LAN. In addition, a programmable logic controller P and an I/O enhancement module A are connected to the network C1 so that they can communicate with the controller H.

Twelve mass flow controllers 40 are connected to the programmable logic controller P via the control bus C2. In addition, a pair of container sensors 10z for each of the storage sections 10S with twelve mass flow controllers 40 are connected to the I/O enhancement module A via signal lines C3.

When the transport vehicle D places a container 50 in the delivering and receiving location of the carry in and out conveyor CV based on a carry-in request from a superordinate management computer (not shown), a carry-in transport command is issued from the stocker controller H2 to the conveyor controller (not shown). And the conveyor controller controls the operation of the carry in and out conveyor CV based on the carry-in transport command to transport the container 50 to the carry in and out location of the carry in and out conveyor CV. When the stocker controller H2 issues a carry-in command to the crane controller H3, the crane controller H3 controls the transport operation of the stacker crane 20 to cause the transfer device 25 to retrieve or pick up the container 50 located in the carry in and out location and to move to a transfer position associated with the target storage section 10S to store the subject container 50 in the target storage section.

The stocker controller H2 is configured to keep track of, or manage, whether a container 50 is stored for each of the plurality of storage sections 10S based on carry in and out operation history of the stacker crane 20. The storage section 10S to store a container 50 is selected by an assigning process (i.e., a storage section selection process) which the stocker controller H2 performs.

More specifically, the stocker controller H2 stores a carry-in transport time table which records carry-in transport time required to carry in the container 50 from the carry in and out location of the carry in and out conveyor CV with the stacker crane 20 for each storage section 10S. This carry-in transport time table is referenced in a storage section selection process to select the storage section 10S with the shortest carry-in transport time among the empty storage sections 10S, as the target storage section 10S for storage.

Once the container 50 is stored in a storage section 10S, nitrogen gas is fed or supplied to the container 50. The supplying of the nitrogen gas to the container 50 is controlled by the purge controller H1. The purge controller H1, through the programmable logic controller P, commands a target flow rate to the mass flow controller 40 which is provided for each of the plurality of storage sections 10S. In addition, the purge controller H1 is provided with a control panel HS for inputting various kinds of information.

The target flow rates commanded by the purge controller H1 include, as some non-limiting examples thereof, a target flow rate for storage which is commanded to the mass flow controller 40 in order to introduce nitrogen gas into the container 50 when this container 50 is stored in the storage section 10S, a target flow rate for nozzle cleaning which is commanded in order to clean the discharge nozzle 10i immediately before the container 50 is stored in the storage section 10S, and a target flow rate for cleaning which is commanded in order to clean the discharge nozzle 10i and the feed pipe Li, etc., at the time of, e.g., installation of the storage shelf 10.

Figure 6:
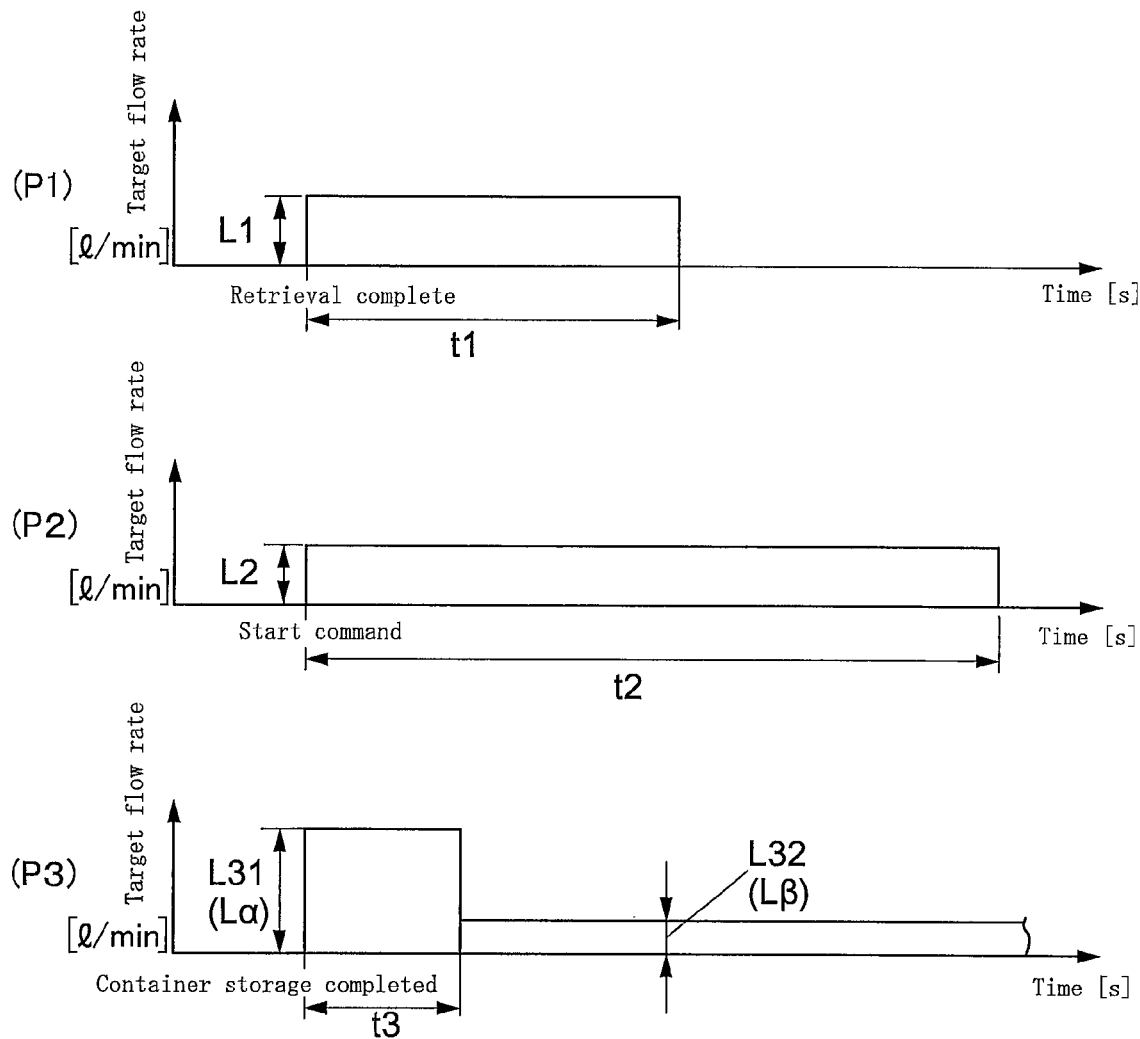
FIG. 6 is explanatory drawing showing how the supply rate of inactive gas is controlled.

In other words, the purge controller H1, as shown in FIG. 6, stores as a plurality of purge patterns each defining a target flow rate and a feed period, a nozzle purge pattern P1, a cleaning pattern P2, and a storage purge pattern P3.

Incidentally, the target flow rate and feed period in the nozzle purge pattern P1, in the cleaning pattern P2, and in the storage purge pattern P3 are set to reference values in advance, and can be changed from the control panel HS which functions as a setting input device.

The nozzle purge pattern P1 is a feed pattern for discharging nitrogen gas from the discharge nozzle 10i of the target storage section 10S for a set period t1 immediately before a container 50 is stored in a storage section 10S. More specifically, when the purge controller H1 receives, from the stocker controller H2, retrieval completion information indicating that the stacker crane 20 has received the container 50 to be carried in from the carry in and out location, the purge controller H1 commands the target flow rate for nozzle cleaning given by the nozzle purge pattern P1 to the mass flow controller 40.

Figure 7:
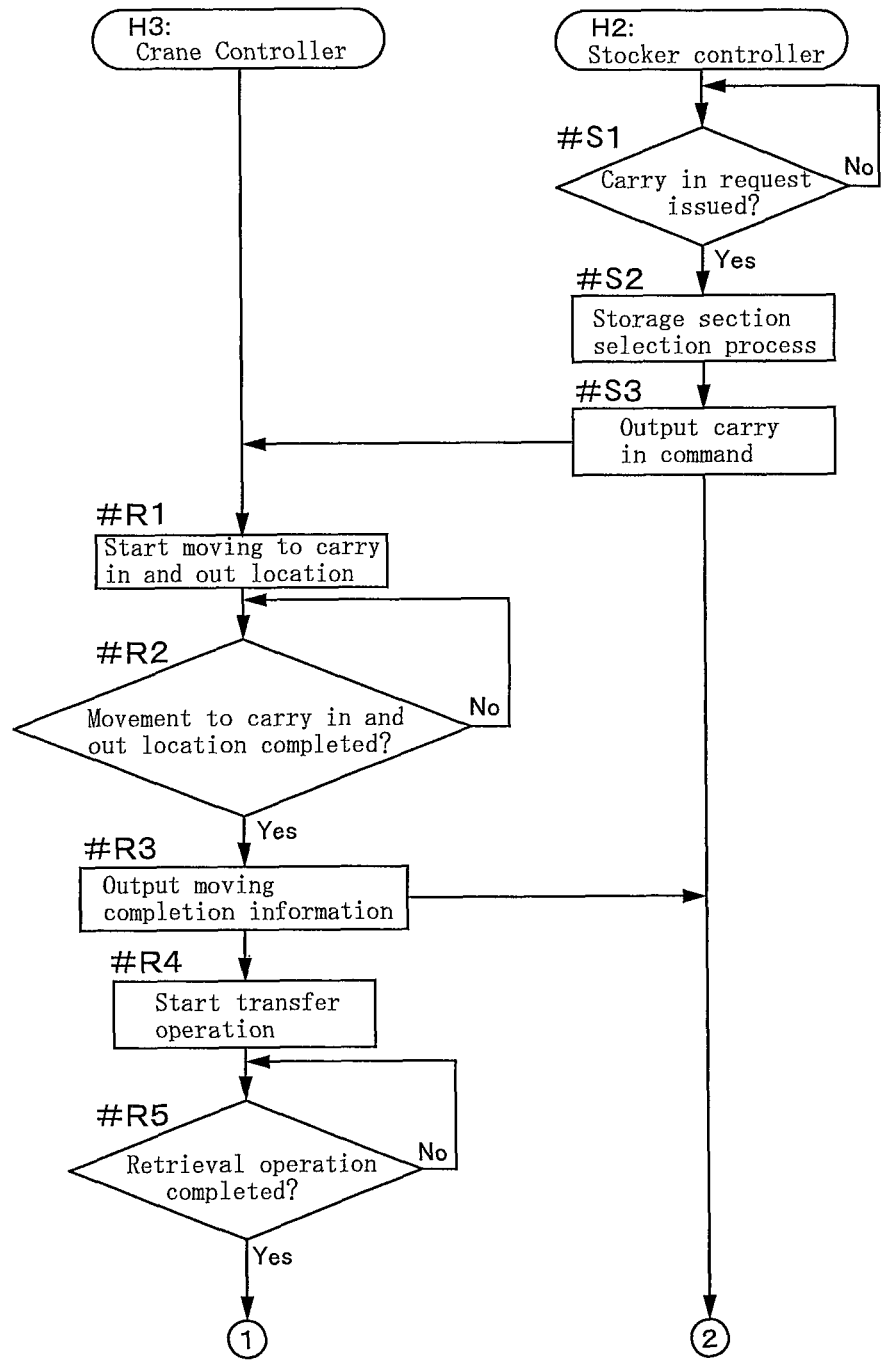
FIG. 7 is a flow chart for transport control of a stacker crane and supply control of nitrogen gas.
Figure 8:
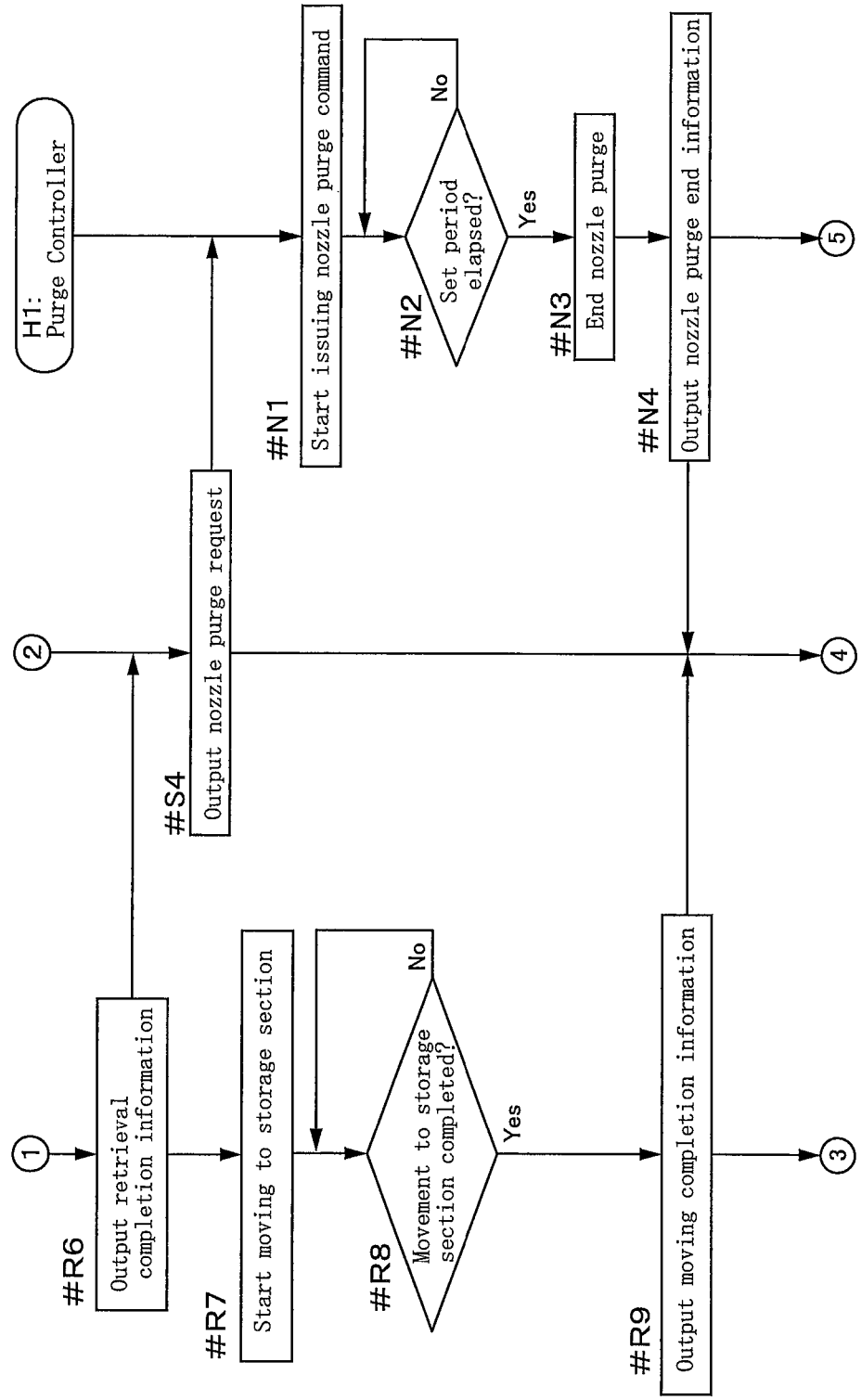
FIG. 8 is a flow chart for transport control of a stacker crane and supply control of nitrogen gas.
Figure 9:
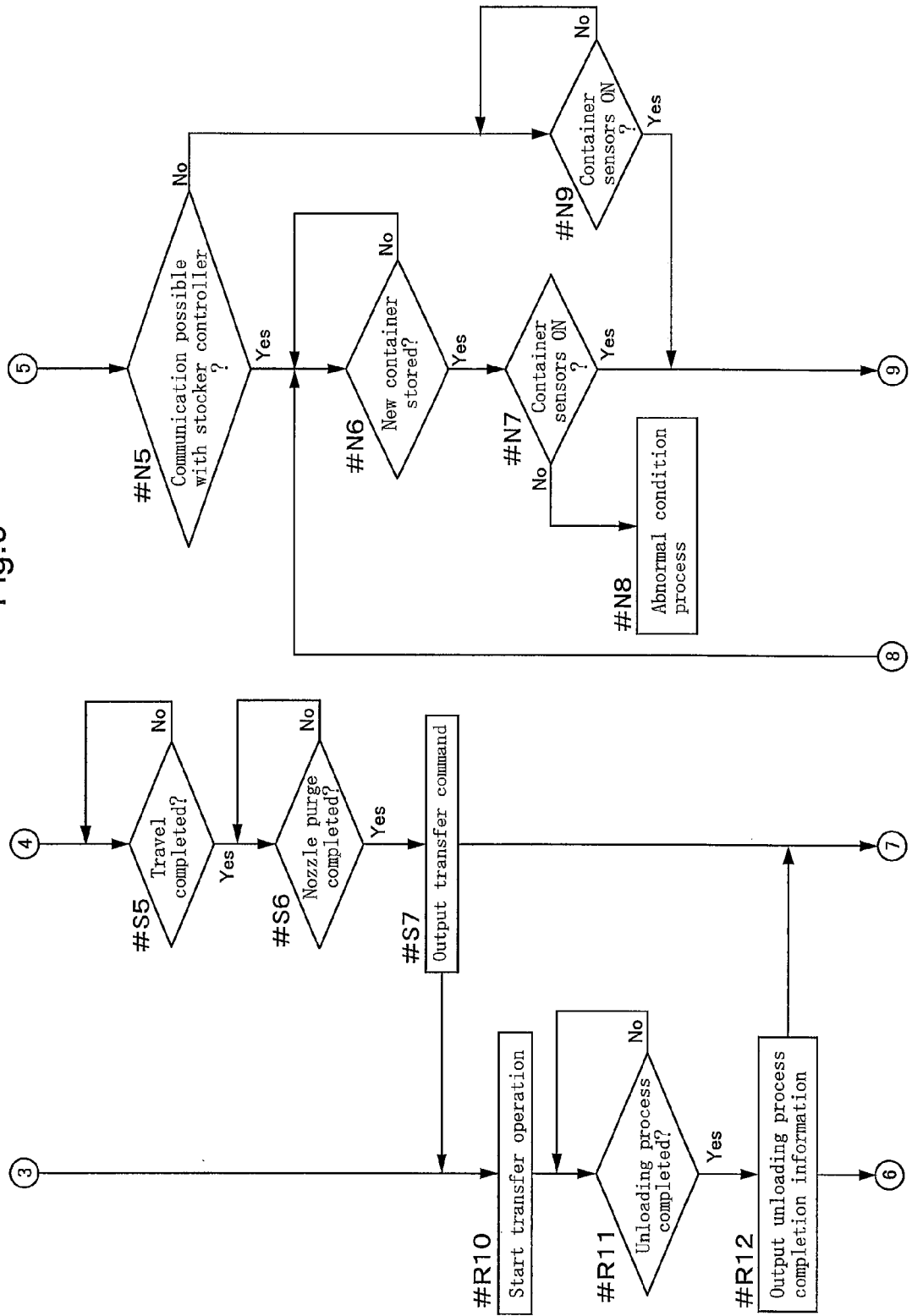
FIG. 9 is a flow chart for transport control of a stacker crane and supply control of nitrogen gas.
Figure 10:
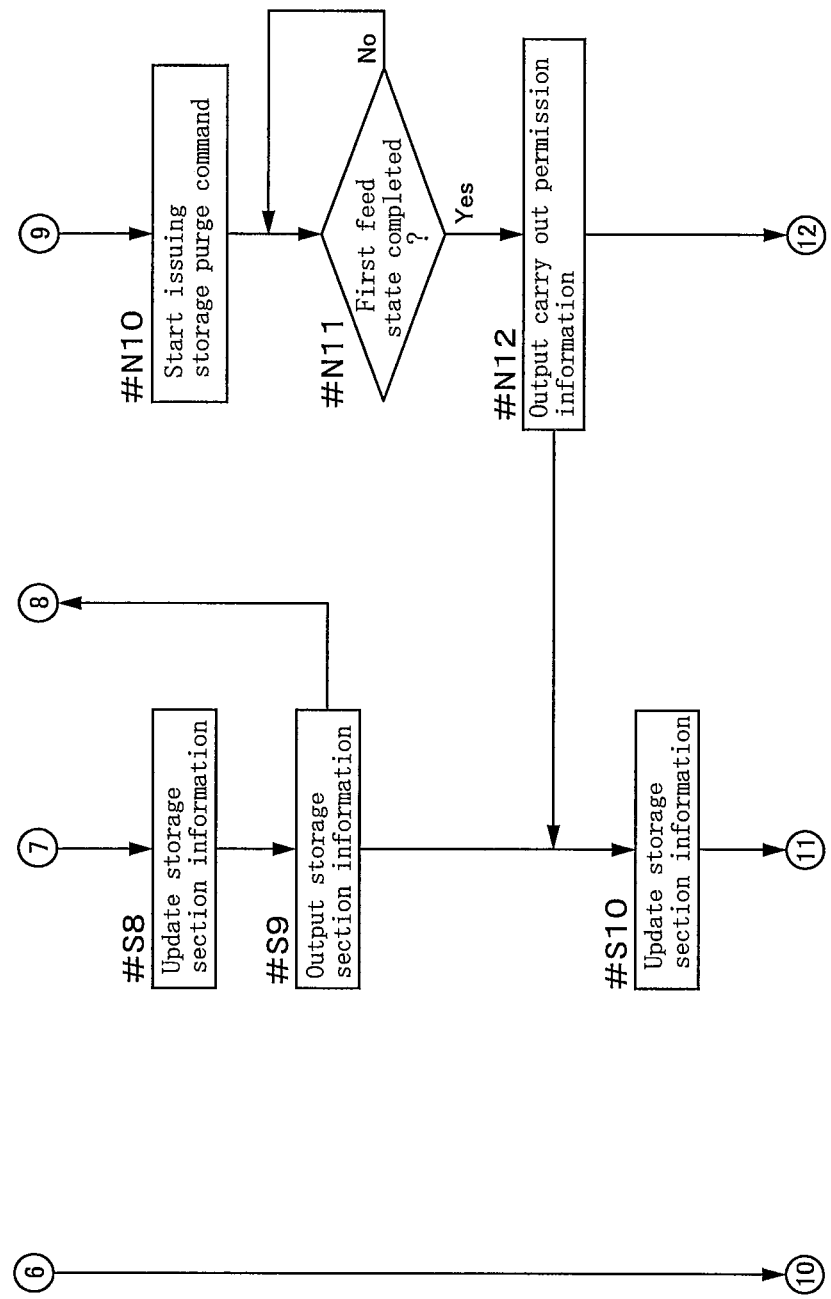
FIG. 10 is a flow chart for transport control of a stacker crane and supply control of nitrogen gas.
Figure 11:
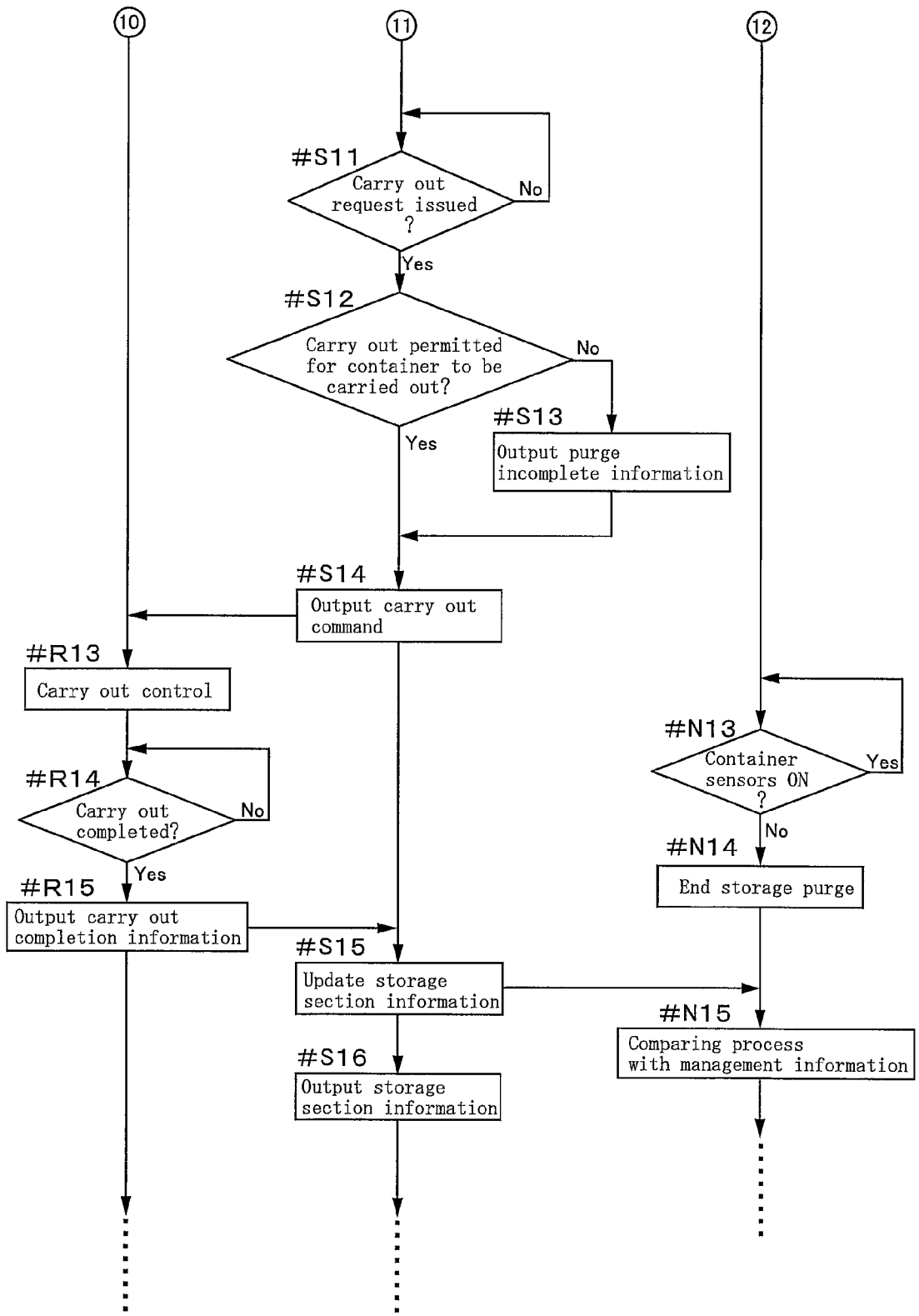
FIG. 11 is a flow chart for transport control of a stacker crane and supply control of nitrogen gas.

As shown in FIG. 7, the nozzle purge pattern P1 is defined as a pattern for feeding nitrogen gas for a period t1 set as pre-storage feed period from the time of reception of the retrieval completion information and at a target flow rate L1 set as the target flow rate for nozzle cleaning.

The set period t1 is set to, e.g., 5 seconds, and the target flow rate L1 is set to, e.g., 30 liters/min.

The cleaning pattern P2 is a pattern used when the storage shelf 10 is first installed and also when all or a part of inactive gas feed section F of a storage section 10S is replaced. The cleaning pattern P2 is a feed pattern for discharging the nitrogen gas from the discharge nozzle 10i in a selected storage section 10S. That is, when a cleaning start command for a particular storage section 10S is issued with the control panel HS, the purge controller H1 commands a target flow rate to the mass flow controller 40 according to the cleaning pattern P2. When this happens, the target flow rate is set to be a flow rate for cleaning, and the feed period is set to be a time period for cleaning.

The cleaning pattern P2 is defined as a pattern for feeding nitrogen gas at a target flow rate L2 which is set as the target feed rate for cleaning, for a period t2 set as a setting initial feed period from issuance of the cleaning start command via the control console HS.

The feed period t2 is set to, e.g., 1800 seconds and the target flow rate L2 is set to, e.g., 20 liters/min.

The storage purge pattern P3 is a feed pattern used for discharging or injecting the nitrogen gas from the discharge nozzle 10i in a storage section 10S after storing a container 50 in the storage section 10S. More specifically, when a pair of container sensors 10z in the storage section 10S in which the container 50 is stored detect that the container 50 is properly stored, the purge controller H1 commands the target flow rate for storage given by the storage purge pattern P3 to the mass flow controller 40.

An initial target flow rate $L\alpha$ and a steady-state target flow rate $L\beta$ which is less than the initial target flow rate $L\alpha$ are set as the target flow rates for storage in the storage purge pattern P3.

The initial target flow rate $L\alpha$ is set to, e.g., 50 liters/min. and the steady-state target flow rate $L\beta$ is set to, e.g., 5 liters/min. As described above, the initial target flow rate $L\alpha$ and the steady-state target flow rate $L\beta$ can be changed and set by the user. The storage purge pattern P3 is defined to be a pattern in which, starting from a container storage completion time at which a storage operation of a container 50 in a storage section 10S is completed, the nitrogen gas is supplied at a supply flow rate L31 which is the initial target flow rate $L\alpha$ for a set feed period t3 (for example, 5 minutes) from the container storage completion time, after which the nitrogen gas is continued to be supplied at a supply flow rate L32 which is the steady-state target flow rate $L\beta$ while the pair of container sensors 10z continue to detect the presence of the container 50.

The purge controller H1 is configured to perform a first control step. Here, the first control step is a step of controlling the operation of a mass flow controller 40 in order to cause the state of the inactive gas feed section F associated with a storage section 10S to be a storage feed state in which the nitrogen gas is discharged from the discharge nozzle 10i according to the storage purge pattern P3 when a container 50 is stored in the storage section 10S, and in order to cause the state of the inactive gas feed section F corresponding to a storage section 10S to be a unfeeding state in which the nitrogen gas is not discharged from the discharge nozzle 10i when a container 50 is not stored in the storage section 10S.

And the controller H which includes the purge controller H1 is configured to perform a second control step. Here, the second control step is a step of controlling operations of the transport device and of the flow rate adjusting device in order to store a container 50 in a storage section 10S after changing the state of the inactive gas feed section F associated with the target storage section 10S (in which the container 50 is to be stored) from the unfeeding state to a pre-storage feed state in which the inactive gas is discharged from the discharge nozzle 10i according to the nozzle purge pattern P1, when storing the container 50 in the storage section 10S using the stacker crane 20.

The purge controller H1 commands the target flow rate for nozzle cleaning to the mass flow controller 40 in accordance with the nozzle purge pattern P1 in the pre-storage feed state. Thus, when the stacker crane 20 receives the container 50 from the carry in and out location, the purge controller H1 changes the state of the inactive gas feed section F, that is associated with the storage section 10S that is to store the subject container 50, from the unfeeding state to the pre-storage feed state in which the nitrogen gas is supplied at the target flow rate for nozzle cleaning given by the nozzle purge pattern P1. Subsequently, the purge controller H1 controls the operation of the mass flow controller 40 to maintain the pre-storage feed state until the end of the set period t1.

In the present embodiment, an operational state of the stacker crane 20 that occurs at a certain point in time before the stacker crane 20 transports the container 50 to the storage section 10S is set or defined in advance as an inactive gas supply start state for starting the gas supply. More specifically, the operational state of the stacker crane 20 at the completion of the receiving of the container 50 from the carry in and out location is set or defined as an inactive gas supply start state for starting the gas supply.

Supply control of the nitrogen gas to the containers 50 performed by the purge controller H1, and transport control of the containers 50 performed by the stocker controller H2 and the crane controller H3 are described next with reference to the flow charts in FIGS. 7 through 11.

First, when the stocker controller H2 receives a carry-in request for a container 50 from the superordinate management computer ("YES" at Step #S1), the stocker controller H2 performs a storage section selection process (Step #S2) to select the storage section 10S in which the container 50 is to be stored and issues a carry-in command to the crane controller H3 at Step #S3.

Upon receiving the carry-in command, the crane controller H3 controls the operation of the traveling carriage 21 and the lift deck 24 at Steps #R1-#R3 to move the transfer device 25 to the transfer position associated with the carry in and out location of the carry in and out conveyor CV and transmits moving completion information to the stocker controller H2 when the moving operation of the container 50 to the carry in and out location is completed.

And, subsequently at Steps #R4-#R6, the crane controller H3 performs a retrieval transfer operation in which the transfer device 25 receives the container 50 that is to be carried in and that is located in the carry in and out location. More specifically, a series of operations are performed sequentially (that is, one after another), such as projecting the support body 25A of the transfer device 25 from the retracted position on the side of, or closer to, the lift deck 24 to the projected position on the side of, or closer to, the carry in and out location, raising the support body 25A by a set amount for transfer, and retracting the support body 25A to the retracted position closer to the lift deck 24. When the retrieving operation is completed, the crane controller H3 transmits retrieval completion information to the stocker controller H2.

When the stocker controller H2 receives the retrieval completion information from the crane controller H3, the stocker controller H2 transmits a nozzle purge request for the storage section 10S in which the container 50 is to be stored to the purge controller H1 (Step #S4). This nozzle purge request includes the position information on the storage section 10S in which the container 50 is to be stored, and information indicating that the retrieval operation from carry in and out location has been completed.

When the purge controller H1 receives the nozzle purge request from the stocker controller H2, the purge controller H1 commands, at Steps #N1-#N3, the target flow rate for nozzle cleaning given by the nozzle purge pattern P1 to the mass flow controller 40 provided to the inactive gas feed section F associated with the storage section 10S in which the container 50 is to be stored. That is, as shown in (P1) of FIG. 6, the target flow rate L1 is commanded during the set period t1 whereas the target flow rate is set to zero after the set period t1 ends or elapses. As such, the inactive gas feed section F, which was in the unfeeding state until the retrieval operation of the container 50 to be carried-in by the stacker crane 20 is completed, is changed to the pre-storage feed state when the retrieval operation of the container 50 to be carried in is completed.

After transmitting retrieval completion information at Step #R6, the crane controller H3 controls the traveling operation of the traveling carriage 21 and the vertical movement operation of the lift deck 24 to proceed with transporting the container 50 to be transported. More specifically, at Steps #R7-#R9, the traveling operation and the vertical movement operation are initiated to cause the transfer device 25 to be moved to and located at the transfer position associated with the storage section 10S in which the container 50 is to be stored, and then moving completion information is transmitted to the stocker controller H2. Depending on the positional relationship between the carry in and out location and the target storage section 10S in which the container 50 is to be stored, the operation necessary to place the transfer device 25 in the transfer position associated with the target storage section 10S may be only one of the traveling operation and the vertical movement operation.

The purge controller H1 supplies the nitrogen gas at the target flow rate L1 for the set period t1 as described above and in parallel with the stacker crane 20 moving the transfer device 25, and transmits nozzle purge end information to the stocker controller H2 at Step #N4 when the set period t1 ends or elapses.

After transmitting the nozzle purge request at step #S4, the stocker controller H2 checks, at Step #S5, whether the travel operation of the stacker crane 20 has been completed based on whether the moving completion information transmitted from the crane controller H3 has been received. If the travel operation of the stacker crane 20 has been completed, the stocker controller H2 checks, at Step #S6, whether the nozzle purge end information from the purge controller H1 has been received. If it has not been received, the stocker controller H2 waits until it receives the nozzle purge end information. And at Step #S7, the stocker controller H2 transmits a transfer command to the crane controller H3 if the nozzle purge end information has been received before or after the wait.

Thus, after the stacker crane 20 has moved the transfer device 25 to the transfer position associated with the target storage section 10S in which the container 50 is to be stored and after the nozzle purge in the target storage section 10S is completed, the stocker controller H2 issues a transfer command to the crane controller H3. This ensures that the nozzle purge is performed for the set period t1 for the target storage section 10S.

The travel operation of the stacker crane 20 may be completed and the transfer device 25 may reach and be located in the transfer position associated with the storage section 10S before the nozzle purge for the storage section 10S is completed, depending on the travel distance of the transfer device 25 to the target storage section 10S in which the container 50 is to be stored. If and when this happens, the transfer operation by the transfer device 25 is suspended until the end of the set period t1 after the nozzle purge is started.

Thus, the controller H is configured to perform a control (transport restraint control) in which the transporting of the container 50 to the target storage section 10S by the stacker crane 20 is not allowed to complete until the set period t1 has elapsed since the state of the inactive gas feed section F associated with the target storage section 10S was changed from the unfeeding state to the pre-storage feed state.

And the transfer operation of the transfer device 25 is started at Step #R10 when the crane controller H3 receives the transfer command issued by the stocker controller H2 at Step #S7.

Thus, the controller H stops the transport operation of the stacker crane 20 if the inactive gas feed section F for the target storage section 10S is in the pre-storage feed state (i.e., the section F is still purging the nozzle 10i) when the container 50 has been transported by the stacker crane 20 and has reached the transfer position associated with the target storage section 10S. And the controller H causes the transport operation of the stacker crane 20 to be resumed after the supplying of the nitrogen gas in the pre-storage feed state of the inactive gas feed section F associated with the target storage section 10S is completed.

In the present embodiment, a feed state determination position is set to be the position of the container 50 when the transfer device 25 is located in the transfer position associated with the target storage section 10S in which the container 50 is to be stored. In other words, the feed state determination position is set at a different position for each of the plurality of storage sections 10S. In addition, each feed state determination position for each of the plurality of storage sections 10S is set to a position closer to the target storage section 10S in the transporting path of the stacker crane 20 than to the position of the container 50 when the operational state of the stacker crane 20 is an inactive gas feed start state (i.e., operational state of the stacker crane 20 at the time of completion of the receiving of the container 50 from the carry in and out location in the present example).

The transfer device 25 may reach and be located in the transfer position associated with the storage section 10S after the nozzle purge for the target storage section 10S is completed depending on the travel distance to the target storage section 10S. When this happens, the purge controller H1 does not command the target flow rate to the mass flow controller 40 after the nozzle purge is completed and until the transfer operation of the transfer device 25 is completed so that the inactive gas feed section F associated with the target storage section 10S remains in the unfeeding state during this time. Subsequently, the purge controller H1 changes the inactive gas feed section F from the unfeeding state to the storage feed state when the transfer operation of the transfer device 25 is completed and the pair of container sensors 10z in the storage section 10S detect the stored container 50.

Thus, the controller H changes the state of the inactive gas feed section F from the pre-storage feed state to the unfeeding state if the container 50 has not been transported to (i.e., has not reached) the target storage section 10S by the time the set period t1 has elapsed since the state of the inactive gas feed section F associated with the target storage section 10S was changed to the pre-storage feed state in which the nitrogen gas is discharged according to the nozzle purge pattern P1. Subsequently, the controller H changes the state of the inactive gas feed section F associated with the target storage section 10S from the unfeeding state to the storage feed state if the container 50 is transported to and reaches the target storage section 10S.

When the transfer operation of the transfer device 25 is completed (i.e., "Yes" at Step #R11), the crane controller H3 proceeds to Step #R12, and transmits transfer completion information to the stocker controller H2. When the stocker controller H2 receives the transfer completion information from the crane controller H3, the stocker controller H2 updates container presence data in storage section information at Step #S8. Specifically, the container presence data is updated to "Container Present" for the storage section 10S selected in the storage section selection step of Step #S2 as the storage section 10S in which the container 50 is to be stored. The stocker controller H2 transmits the updated storage section information to the purge controller H1 at Step #S9.

The purge controller H1 is always monitoring whether it is in the state in which communication with the stocker controller H2 is possible. And the conditions under which the feed state is changed to the storage feed state are different (Step #N5) depending on whether the communication is possible (for example, the article storage facility is operated in an automatic mode) or the communication is not possible (for example, when the article storage facility is operated in a manual mode).

More specifically, when the purge controller H1 is in the state in which communication is possible with the stocker controller H2 (i.e., "Yes" at Step #N5), the purge controller H1 determines whether there is a storage section 10S in which a container 50 has been newly stored (i.e., if there is a storage section 10S whose status is newly updated to "Container Present") based on the storage section information transmitted from the stocker controller H2 (Step #N6). If there is a storage section 10S in which the container 50 has been newly stored, the purge controller H1 checks detected information from the pair of container sensors 10z provided to the storage section 10S in question (Step #N7). If both of the pair of container sensors 10z have detected the container 50, the purge controller H1 determines that the container 50 is properly stored in the storage section 10S, and proceeds to Step #N10 and performs the change to the storage feed state. If either of the pair of container sensors 10z has not detected the container 50, the purge controller H1 determines that the container 50 is not properly stored in the storage section 10S, and proceeds to Step #N8 and performs an abnormal condition process, such as a report process.

When the purge controller H1 is not in the state in which communication is possible with the stocker controller H2 (i.e., "No" at Step #N5), the purge controller H1 checks detected information from the pair of container sensors 10z (Step #N7). If both of the pair of container sensors 10z have detected the container 50, the purge controller H1 determines that the container 50 is properly stored in the storage section 10S, and proceeds to Step #N10 and performs the change to the storage feed state. If the purge controller H1 is not in the state in which communication with the stocker controller H2 is possible, a human operator stores the container 50 in the storage section 10S.

On arriving at Step #N10 based on the detected information from the container sensor 10z, the purge controller H1 commands the target flow rate for storage given by the storage purge pattern P3 to the mass flow controller 40 provided to the inactive gas feed section F associated with the storage section 10S in which the container was stored. More specifically, as shown in (P3) of FIG. 6, the nitrogen gas is supplied at the supply flow rate L31 which is the initial target flow rate Lα (first feed state) for the set feed period t3 (for example, 5 minutes), after which, the nitrogen gas is continued to be supplied at the supply flow rate L32 which is the steady-state target flow rate Lβ (the second feed state) as long as the pair of container sensors 10z are detecting the presence of the container 50.

When it is determined at Step #N11 that the first feed state is completed after changing to the storage feed state, the purge controller H1 proceeds to Step #N12 and transmits carry out permission information to the stocker controller H2. Upon receiving the carry out permission information, the stocker controller H2 updates carry out permission flag information in the storage section information for the storage section 10S in question at Step #S10 and reports it to the superordinate management computer.

When there is a carry out request from the superordinate management computer, the stocker controller H2 proceeds from Step #S11 to Step #S12 and refers to the storage section information to check to see if the carry out permission flag information for the storage section 10S in which the container 50 to be carried out is stored is in the permitted state. When the request is a carry out request for the storage section 10S that is not in the permitted state, the stocker controller H2 transmits a carry out command to the crane controller H3 at Step #S14 after transmitting at Step #S13, to the superordinate management computer, purge incomplete information which indicates that the nitrogen gas is not sufficiently supplied to the container 50 to be carried out. When the request is a carry out request for the storage section 10S that is in the permitted state, the stocker controller H2 proceeds from Step #S12 to Step #S14 and transmits a carry out command to the crane controller H3 without transmitting the purge incomplete information.

The crane controller H3 performs a carry out control at Step #R13 when it receives the carry out command from the stocker controller H2. As a result, the container 50 to be carried out is transported by the stacker crane 20 from the storage section 10S in which the container 50 was stored to the carry in and out location of the carry in and out conveyor CV. The container 50 delivered to the carry in and out location is transported to the delivering and receiving location by the carry in and out conveyor CV, and is taken out by the transport vehicle D.

When the container 50 is taken out from the storage section 10S in which the container 50 was stored by a carry out operation of the stacker crane 20, the pair of container sensors 10z in the storage section 10S in question change from a state in which the container 50 is detected to a state in which the container 50 is not detected. This causes the purge controller H1 to stop commanding the target flow rate to the mass flow controller 40 at Step #N13 and Step #N14.

When the carry-out operation is completed as the stacker crane 20 finishes transporting the container 50 to be carried out to the carry in and out location of the carry in and out conveyor CV (i.e., "Yes" at Step #R14), the crane controller H3 transmits carry out completion information to the stocker controller H2 (Step #R15). Upon receiving this information, the stocker controller H2 updates the container presence data, in the storage section information for the storage section 10S in which the container 50 was stored, to "No Container" at Step #S15, and transmits the updated storage section information to the purge controller H1 at step #S16. Upon receiving this information, the purge controller H1 compares it with the management information which the purge controller H1 stores for each storage section 10S at Step #N15, and causes the contents of the updated storage section information to be reflected in the management information if there is no discrepancy.

If there is a storage section 10S for which the container presence data in the purge controller H1 and the management information in the stocker controller H2 do not agree, the purge controller H1 sets a flag which prohibits use of the storage section 10S in question, and transmits a notification to that effect to the stocker controller H2. As a result, the storage section 10S in question is prevented from being selected as the storage section 10S to which the container 50 is to be stored in a subsequent storage section selection process (Step #S2) performed when a subsequent carry-in request is issued.

Alternative Embodiments (1) In the embodiment described above, an example was described in which the storage sections 10S of the storage shelf 10 function as storage sections for storing transporting containers. However, other various storage sections may be used as storage sections, such as suspended storage sections provided to a lateral side of the guide rail G for the hoist type transport vehicle D.

(2) In the embodiment described above, an example is described in which nitrogen gas is used as inactive gas. However, other various inactive gas besides nitrogen gas, such as gaseous argon etc., with low reactivity to the stored substrates may be used instead. The inactive gas used in the present invention needs to be gas with low oxygen content and low absolute humidity.

(3) In the embodiment described above, an example is described in which the inactive gas feed section F is consists mainly of the discharge nozzle 10i and the mass flow controller 40 having an internal control unit. However, the embodiments of the present invention are not limited to this arrangement. For example, a flow rate adjusting valve for variably controlling the supply flow rate of the nitrogen gas to a container 50 and a flow rate sensor for measuring the supply flow rate of the nitrogen gas to the container 50 may be provided in feed passage for the nitrogen gas. And the controller H may be configured to control the operation of the flow rate adjusting valve based on the detected information of the flow rate sensor.

In this case, the inactive gas feed section F consists primarily of the discharge nozzle 10i and the flow rate adjusting valve.

(4) In the embodiment described above, an example is described in which the controller H controls the operation of the mass flow controller 40 to suspend the supply of the nitrogen gas by the inactive gas feed section F until the container 50 is transported to and reaches the storage section 10S after the set period t1 has elapsed after the state of the inactive gas feed section F associated with the storage section 10S in which the container 50 is to be stored was changed from the unfeeding state in which the nitrogen gas is not discharged from the discharge nozzle 10i to the pre-storage feed state in which the nitrogen gas is discharged from the discharge nozzle 10i according to the nozzle purge pattern P1.

Instead, the controller H may be configured to control the operation of the mass flow controller 40 to continue with the discharging of the nitrogen gas from the discharge nozzle 10i according to the nozzle purge pattern P1 (i.e., supplying of the nitrogen gas in the pre-storage feed state) until the container 50 reaches the storage section 10S if the transporting of the container 50 to the storage section 10S in question has not been completed when the set period t1 has elapsed after the state of the inactive gas feed section F associated with the storage section 10S in which the container 50 is to be stored was changed from the unfeeding state to the pre-storage feed state.

In this case, dust or vapor and oxygen in the ambient air can be prevented from entering the discharge nozzle 10i until the container 50 reaches the storage section 10S in question after the set period t1 has elapsed after the state of the inactive gas feed section F was changed from the unfeeding state to the pre-storage feed state. Thus, dust, vapor, or oxygen can be prevented from entering the container 50 when the container 50 is stored and supply of nitrogen gas is started according to the storage purge pattern P3.

In addition, after the set period t1 ends, a target flow rate may be commanded to the mass flow controller 40 in order to discharge the nitrogen gas at a target flow rate for container standby (for example, 15 liters/min.) which is less than the target flow rate for nozzle cleaning according to the nozzle purge pattern P1.

(5) In the embodiment described above, an example is described in which the transporting containers are FOUPs, in which the substrates stored in them are semiconductor wafers, and in which nitrogen gas is supplied to the FOUPs as the inactive gas. However, the embodiments of the present invention are not limited to this arrangement. For example, the substrates stored in the transporting containers may be reticles, and the transporting container may be reticle containers.

(6) In the embodiment described above, an example is described in which the set period t1 for which the pre-storage feed state is maintained may be changed. However, the set period t1 may be a fixed value that can not be changed.

(7) In the embodiment described above, the target flow rate of the nitrogen gas supplied to the container 50 in the storage feed state is defined such that it has two steps, namely, the first target flow rate value (the initial target flow rate $L\alpha$) and the second target flow rate value (the steady-state target flow rate $L\beta$) which is less than the first target flow rate value. However, the embodiments of the present invention are not limited to this arrangement. For example, the target flow rate of the nitrogen gas may be defined such that it has three or more different steps. And the mass flow controller 40 may be configured to operate such that the flow rate is changed to the first target flow rate value, then to the second target flow rate value, then to the third target flow rate value, and so on. In addition, the nitrogen gas at each target flow rate value may be supplied intermittently.

(8) In the embodiment described above, an example is described in which inactive gas is supplied in a different manner between the pre-storage feed state and the storage feed state. However, inactive gas may be supplied in the same manner between the pre-storage feed state and the storage feed state.

(9) In the embodiment described above, an example is described in which transport restraint control is defined to be a control in which the transfer operation of the transporting container to the storage section in which the container is to be stored is interrupted. Instead, the transport restraint control may be defined to be one in which the transport speed of the transport device is reduced. For example, when the transport device is the stacker cranes 20 as in the embodiment described above, one or more of the travel speed of the traveling carriage 21, the vertical movement speed of the lift deck 24, and the projecting and retracting speed of the transfer device 25 may be reduced.

(10) In the embodiment described above, an example is described in which the transport restraint control is performed. Instead, the transporting of the transporting container to the storage section in question may be allowed to be completed even when the set period has not elapsed since the state of the inactive gas feed section associated with the storage section in which the container is to be stored was changed from the unfeeding state to the pre-storage feed state. In this case, the state of the inactive gas feed section may be changed to the storage feed state before the set period has elapsed since the state of the inactive gas feed section was changed from the unfeeding state to the pre-storage feed state.

(11) In the embodiment described above, an example is described in which the transport device is the stacker crane 20 and in which the inactive gas feed start state is the operational state of the stacker crane at the time that the retrieval operation by the stacker crane is completed. Instead, the transport device may consist of a plurality of devices which transport transporting containers. And a specific operational state of one of the plurality of transport devices may be defined as the inactive gas feed start state. For example, in the embodiment described above, the transport device may be considered to consist of the carry in and out conveyor CV and the stacker crane 20. And the operational state of the carry in and out conveyor CV at the time of the carry in and out conveyor CV completing the transport of the container 50 to the carry in and out location may be defined as the inactive gas feed start state.

Alternatively, the inactive gas feed start state may be defined to be a specific operational state of the stacker crane 20 when it is operating to receive the container 50 to be transported, or a specific operational state of the stacker crane 20 when it is actually moving the container 50 after receiving the container 50. Such a specific operational state may be specified, for example, by the travel position of the traveling carriage 21, and/or the vertical position of the lift deck 24.

(12) In the embodiment described above, an example is described in which the state of the inactive gas feed section associated with the storage section in which the container is to be stored is changed from the unfeeding state to the pre-storage feed state if the operational state of the transport device has become the inactive gas feed start state. However, the embodiments of the present invention are not limited to this arrangement. That is, the timing at which the state of the inactive gas feed section associated with the storage section in which the container is to be stored is changed from the unfeeding state to the pre-storage feed state may be suitably changed. For example, in the embodiment described above, the state of the inactive gas feed section associated with the storage section in which the container is to be stored may be changed from the unfeeding state to the pre-storage feed state if and when the stocker controller H2 issues a carry-in command to the crane controller H3.

What is claimed is:

1. An article storage facility comprising:
    a plurality of storage sections for storing transporting containers for housing substrates;
    a transport device for transporting the transporting containers to the plurality of storage sections;
    an inactive gas feed section provided to each of the plurality of storage sections wherein the inactive gas feed section includes a discharge opening for discharging inactive gas and a flow rate adjusting device which can adjust a flow rate of the inactive gas discharged from the discharge opening wherein the inactive gas feed section is configured to supply the inactive gas to inside the transporting container that is stored in associated one of the plurality of storage sections;
    a controller configured to control operations of the transport device and the flow rate adjusting device;
    wherein the controller is configured to keep track of whether the transporting container is stored for each of the plurality of storage sections and to control operation of the flow rate adjusting device of each of a plurality of the inactive gas feed sections in order to cause a state of the inactive gas feed section associated with the storage section in which the transporting container is stored to be a storage feed state in which the inactive gas is discharged from the discharge opening and to cause a state of the inactive gas feed section associated with the storage section in which none of the transporting containers is stored and for which no supply request for the inactive gas is issued to be an unfeeding state in which the inactive gas is not discharged from the discharge opening;
    wherein in response to a discharge opening purge request which comprises the supply request which is issued when storing the transporting container in the storage section with the said transport device and which includes information of the storage section in which the transporting container is to be stored, the controller is further configured to control operation of the transport device and operation of the flow rate adjusting device in order to change the state of said inactive gas feed section associated with the storage section in which the transporting container is to be stored from the unfeeding state to a pre-storage feed state in which the inactive gas is discharged from the discharge opening and then to store the transporting container in the storage section after changing the state of the inactive gas feed section from the unfeeding state to the pre-storage feed state;
    wherein a feed state determination position is set to be closer to a position of the storage section in which the container is to be stored, in the transporting path for the transport device, than to a position of the transporting container when the operational state of the transport device becomes the inactive gas feed start state; and
    wherein the controller is configured to maintain the pre-storage feed state until a set period has elapsed from a point in time of changing the state of the inactive gas feed section associated with the storage section in which the transporting container is to be stored from the unfeeding state to the pre-storage feed state and to control operations of the flow rate adjusting device and the transport device in order to stop transport operation of the transport device if the state of the inactive gas feed section associated with the storage section in which the container is to be stored is the pre-storage feed state when the transporting container is transported by the transport device to and reaches the feed state determination position, and in order to resume the transport operation of the transport device after supplying of the inactive gas by the inactive gas feed section in the pre-storage feed state is completed.

2. The article storage facility as defined in claim 1, wherein:
    an operational state of the transport device that occurs at a certain point in time before the transporting container is transported to and reaches the storage section is defined in advance to be an inactive gas feed start state, and wherein the controller is configured to control operation of the flow rate adjusting device in order to change the state of the inactive gas feed section associated with the storage section in which the transporting container is to be stored from the unfeeding state to the pre-storage feed state in response to said discharge opening purge request which is issued if the operational state of the transport device becomes the inactive gas feed start state.

3. The article storage facility as defined in claim 1, wherein:
until a set period lapses from a point in time of changing the state of the inactive gas feed section associated with the storage section in which the transporting container is to be stored from the unfeeding state to the pre-storage feed state, the controller is configured to maintain the pre-storage feed state and then upon lapse of the set period from the point in time of changing, if the transporting container has not reached the storage section, the controller is configured to control operation of the flow rate adjusting device in order to change the state of the inactive gas feed section to the unfeeding state from the pre-storage feed state and thereafter to change the state of the inactive gas feed section from the unfeeding state to the storage feed state if the transporting container reaches the storage section.

4. The article storage facility as defined in claim 1, wherein:
in order to maintain the pre-storage feed state until a set period lapses from a point in time of changing the state of the inactive gas feed section associated with the storage section in which the transporting container is to be stored from the unfeeding state to the pre-storage feed state, the controller is configured to control operation of the flow rate adjusting device and perform a transport restraint control in which transporting of the transporting container to the storage section by the transport device is not allowed to complete until the set period has elapsed from the point in time of changing.

5. The article storage facility as defined in claim 1, wherein:
the controller is configured to control operations of the flow rate adjusting device and the transport device in order to maintain the supplying of the inactive gas by the inactive gas feed section in the pre-storage feed state until the transporting container reaches the storage section after changing the state of the inactive gas feed section associated with the storage section in which the transporting container is to be stored from the unfeeding state to the pre-storage feed state.

6. An article storage method that uses an article storage facility including:
a plurality of storage sections for storing transporting containers for housing substrates;
a transport device for transporting the transporting containers to the plurality of storage sections;
an inactive gas feed section provided to each of the plurality of the storage sections wherein the inactive gas feed section includes a discharge opening for discharging inactive gas and a flow rate adjusting device which can adjust a flow rate of the inactive gas discharged from the discharge opening wherein the inactive gas feed section is configured to supply the inactive gas to inside the transporting container that is stored in associated one of the plurality of storage sections; and
a controller configured to control operations of the transport device and the flow rate adjusting device;
the article storage method comprising the following steps that are performed by the controller:
a first control step of keeping track of whether the transporting container is stored for each of the plurality of storage sections and controlling operation of the flow rate adjusting device of each of a plurality of the inactive gas feed sections in order to cause a state of the inactive gas feed section associated with the storage section in which the transporting container is stored to be a storage feed state in which the inactive gas is discharged from the discharge opening and to cause a state of the inactive gas feed section associated with the storage section in which none of the transporting containers is stored and for which no supply request for the inactive gas is issued to be an unfeeding state in which the inactive gas is not discharged from the discharge opening;
a second control step of controlling operation of the transport device and operation of the flow rate adjusting device in response to a discharge opening purge request which comprises the supply request which is issued when storing the transporting container in the storage section with the said transport device and which includes information of the storage section in which the transporting container is to be stored, in order to change the state of said inactive gas feed section associated with the storage section in which the transporting container is to be stored from the unfeeding state to a pre-storage feed state in which the inactive gas is discharged from the discharge opening and then to store the transporting container in the storage section after changing the state of the inactive gas feed section from the unfeeding state to the pre-storage feed state;
wherein a feed state determination position is set to be closer to a position of the storage section in which the container is to be stored, in the transporting path for the transport device, than to a position of the transporting container when the operational state of the transport device becomes the inactive gas feed start state; and
wherein, in the second control step, the pre-storage feed state is maintained until a set period has elapsed from a point in time of changing the state of the inactive gas feed section associated with the storage section in which the transporting container is to be stored from the unfeeding state to the pre-storage feed state and operations of the flow rate adjusting device and the transport device are controlled in order to stop transport operation of the transport device if the state of the inactive gas feed section associated with the storage section in which the transporting container is to be stored is the pre-storage feed state when the transporting container is transported by the transport device to and reaches the feed state determination position, and in order to resume the transport operation of the transport device after supplying of the inactive gas by the inactive gas feed section in the pre-storage feed state is completed.

7. The article storage method as defined in claim 6, wherein:
an operational state of the transport device that occurs at a certain point in time before the transporting container is transported to and reaches the storage section is defined in advance to be an inactive gas feed start state, and
wherein, in the second control step, operation of the flow rate adjusting device is controlled in order to change the state of the inactive gas feed section associated with the storage section in which the transporting container is to be stored from the unfeeding state to the pre-storage feed state in response to said discharge opening purge request which is issued if the operational state of the transport device becomes the inactive gas feed start state.

8. The article storage method as defined in claim 6, wherein:

in the second control step, until a set period lapses from a point in time of changing the state of the inactive gas feed section associated with the storage section in which the transporting container is to be stored from the unfeeding state to the pre-storage feed state, the pre-storage feed state is maintained and then upon lapse of the set period from the point in time of changing, if the transporting container has not reached the storage section, operation of the flow rate adjusting device is controlled in order to change the state of the inactive gas feed section to the unfeeding state from the pre-storage feed state and thereafter to change the state of the inactive gas feed section from the unfeeding state to the storage feed state if the transporting container reaches the storage section.

9. The article storage method as defined in claim 6, wherein:

in the second step, in order to maintain the pre-storage feed state until a set period elapses from a point in time of changing the state of the inactive gas feed section associated with the storage section in which the transporting container is to be stored from the unfeeding state to the pre-storage feed state, operation of the flow rate adjusting device is controlled and a transport restraint control is performed in which transporting of the transporting container to the storage section by the transport device is not allowed to complete until the set period has elapsed from the point in time of changing.

10. The article storage method as defined in claim 6, wherein:

in the second control step, operations of the flow rate adjusting device and the transport device are controlled in order to maintain the supplying of the inactive gas by the inactive gas feed section in the pre-storage feed state until the transporting container reaches the storage section after changing the state of the inactive gas feed section associated with the storage section in which the transporting container is to be stored from the unfeeding state to the pre-storage feed state.

* * * * *